United States Patent
Lien et al.

(10) Patent No.: US 11,335,411 B1
(45) Date of Patent: May 17, 2022

(54) ERASE OPERATION FOR MEMORY DEVICE WITH STAIRCASE WORD LINE VOLTAGE DURING ERASE PULSE

(71) Applicant: SanDisk Technologies LLC, Addison, TX (US)

(72) Inventors: Yu-Chung Lien, San Jose, CA (US); Keyur Payak, Milpitas, CA (US); Huai-Yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/191,315

(22) Filed: Mar. 3, 2021

(51) Int. Cl.
| G11C 16/14 | (2006.01) |
| G11C 16/34 | (2006.01) |
| G11C 16/04 | (2006.01) |
| G11C 16/08 | (2006.01) |
| H01L 27/11582 | (2017.01) |
| H01L 27/11556 | (2017.01) |

(52) U.S. Cl.
CPC .......... *G11C 16/14* (2013.01); *G11C 16/0483* (2013.01); *G11C 16/08* (2013.01); *G11C 16/3445* (2013.01); *H01L 27/11556* (2013.01); *H01L 27/11582* (2013.01)

(58) Field of Classification Search
CPC ..... G11C 16/14; G11C 16/0483; G11C 16/08; G11C 16/3445; H01L 27/11556; H01L 27/11582
See application file for complete search history.

(56) References Cited

U.S. PATENT DOCUMENTS

| 7,852,683 B2 | 12/2010 | Lutze et al. |
| 8,599,622 B2 | 12/2013 | Kim et al. |
| 9,142,305 B2 | 9/2015 | Dunga et al. |
| 10,068,651 B1 | 9/2018 | Diep et al. |
| 2015/0170748 A1 | 6/2015 | Costa et al. |
| 2016/0141299 A1 | 5/2016 | Hong |

FOREIGN PATENT DOCUMENTS

| CN | 105453183 B | * 10/2019 | ......... G11C 11/5635 |
| KR | 10-2013-0097592 A | 9/2013 | |
| KR | 10-2055942 B1 | 12/2019 | |
| WO | WO2019/045806 A1 | 3/2019 | |

OTHER PUBLICATIONS

International Search Report & The Written Opinion of the International Searching Authority dated Feb. 21, 2022, International Application No. PCT/US2021/033676.

* cited by examiner

*Primary Examiner* — Sultana Begum
(74) *Attorney, Agent, or Firm* — Vierra Magen Marcus LLP

(57) ABSTRACT

Apparatuses and techniques are described for performing an erase operation for a set of memory cells, where the erase operation applies a staircase or multi-level word line voltage concurrent with a fixed level erase pulse to provide multiple channel-to-gate voltages. Current consumption and time are saved compared to applying a multi-level erase voltage to a high capacitance substrate, for example. In one approach, the word line voltage is changed from a positive erase-enable voltage to a negative erase-enable voltage during the multi-level erase pulse. A step size of a next erase pulse can be set to achieve an approximately constant step increase in channel-to-gate voltages of the memory cells.

20 Claims, 22 Drawing Sheets

Fig. 1A
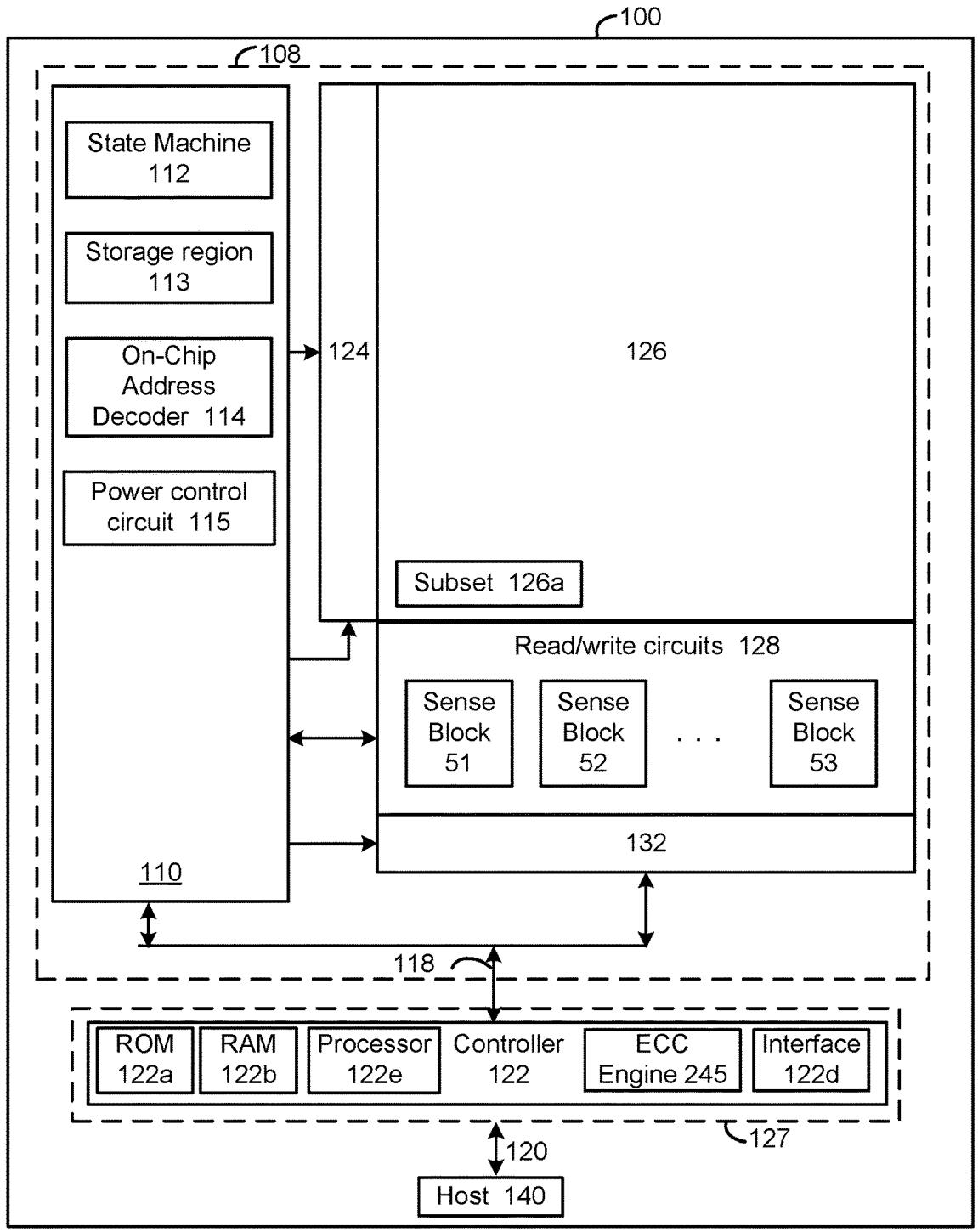
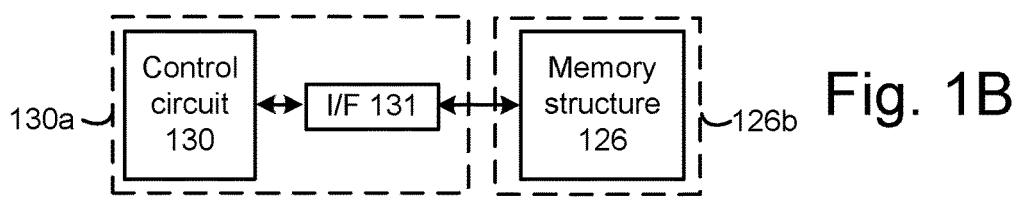
Fig. 1B

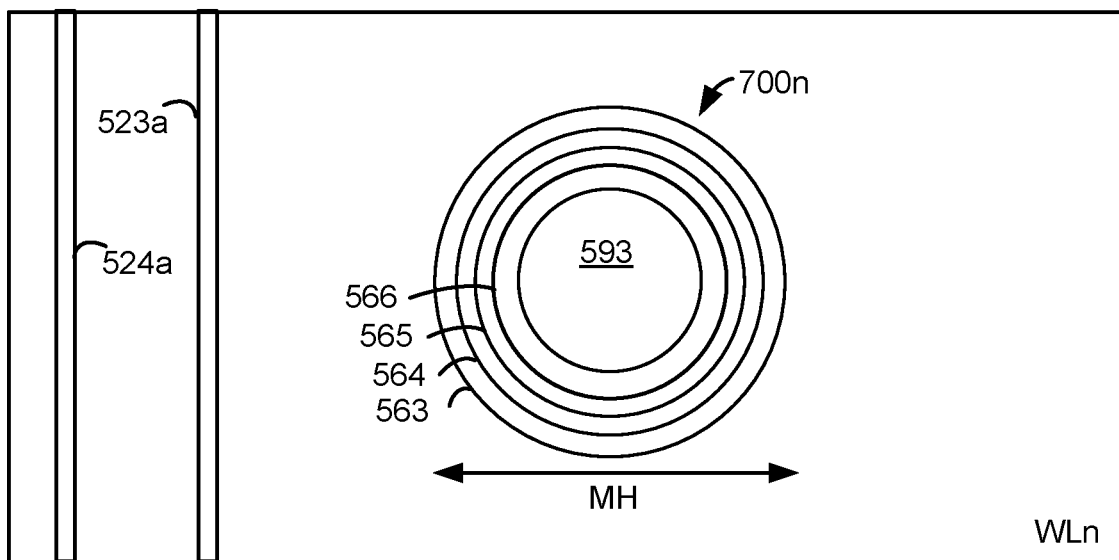

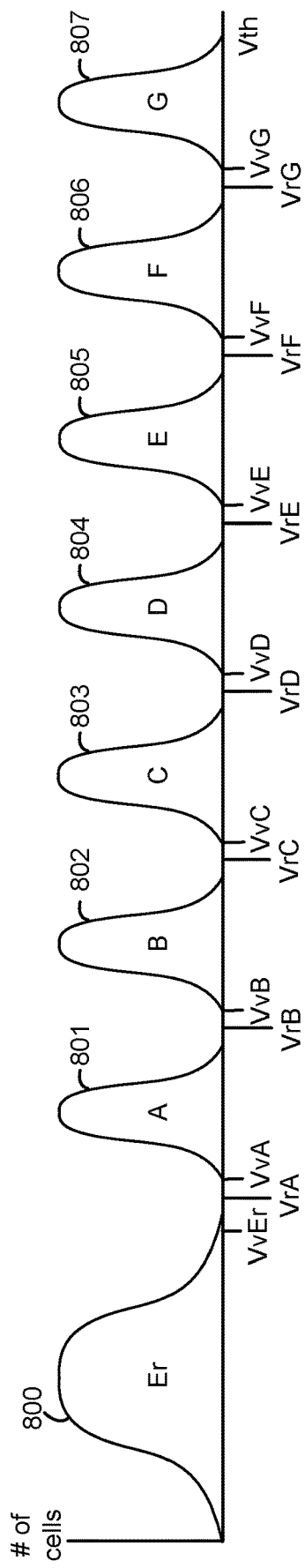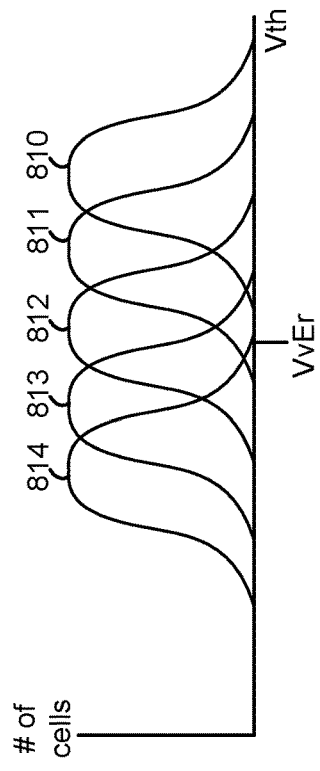
Fig. 8A
Fig. 8B

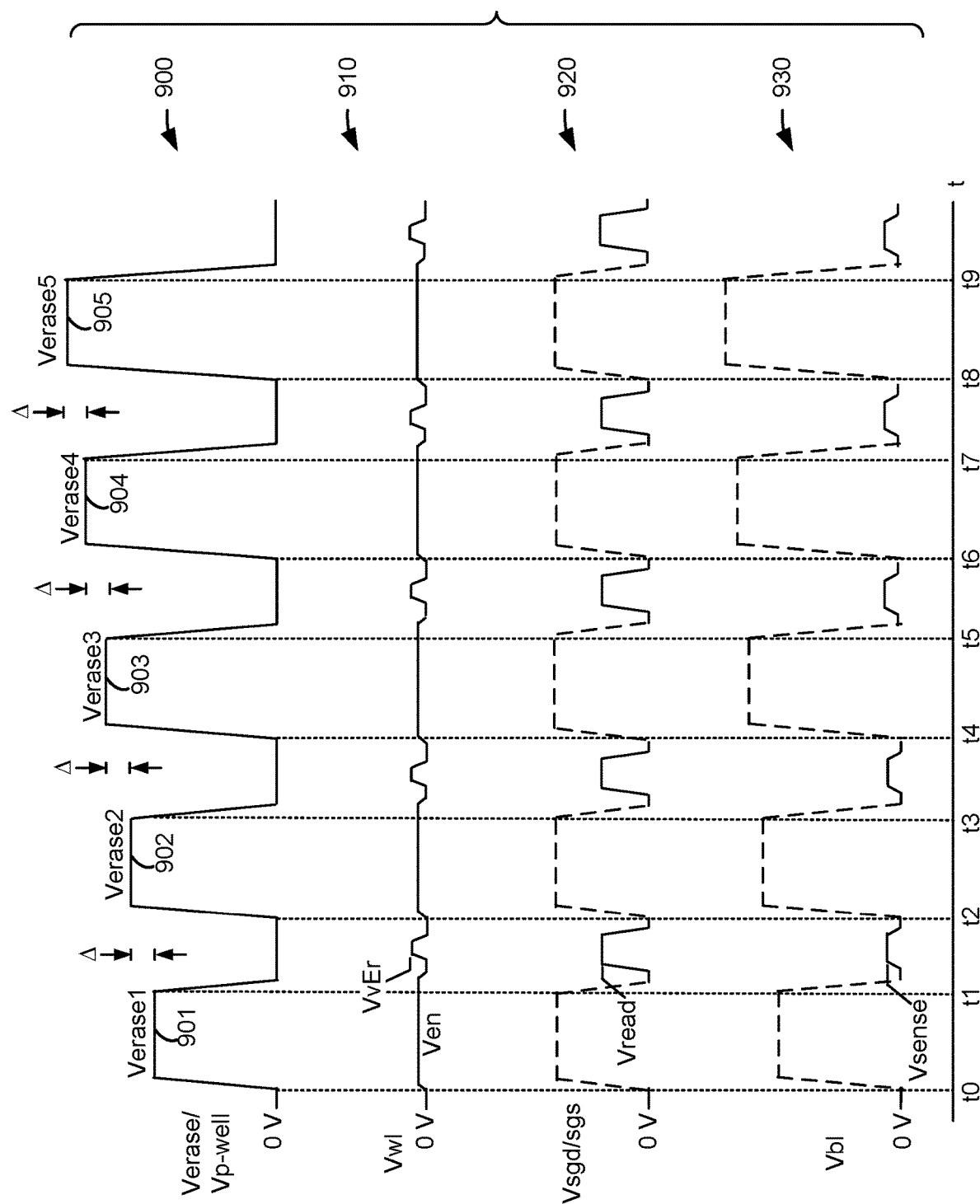

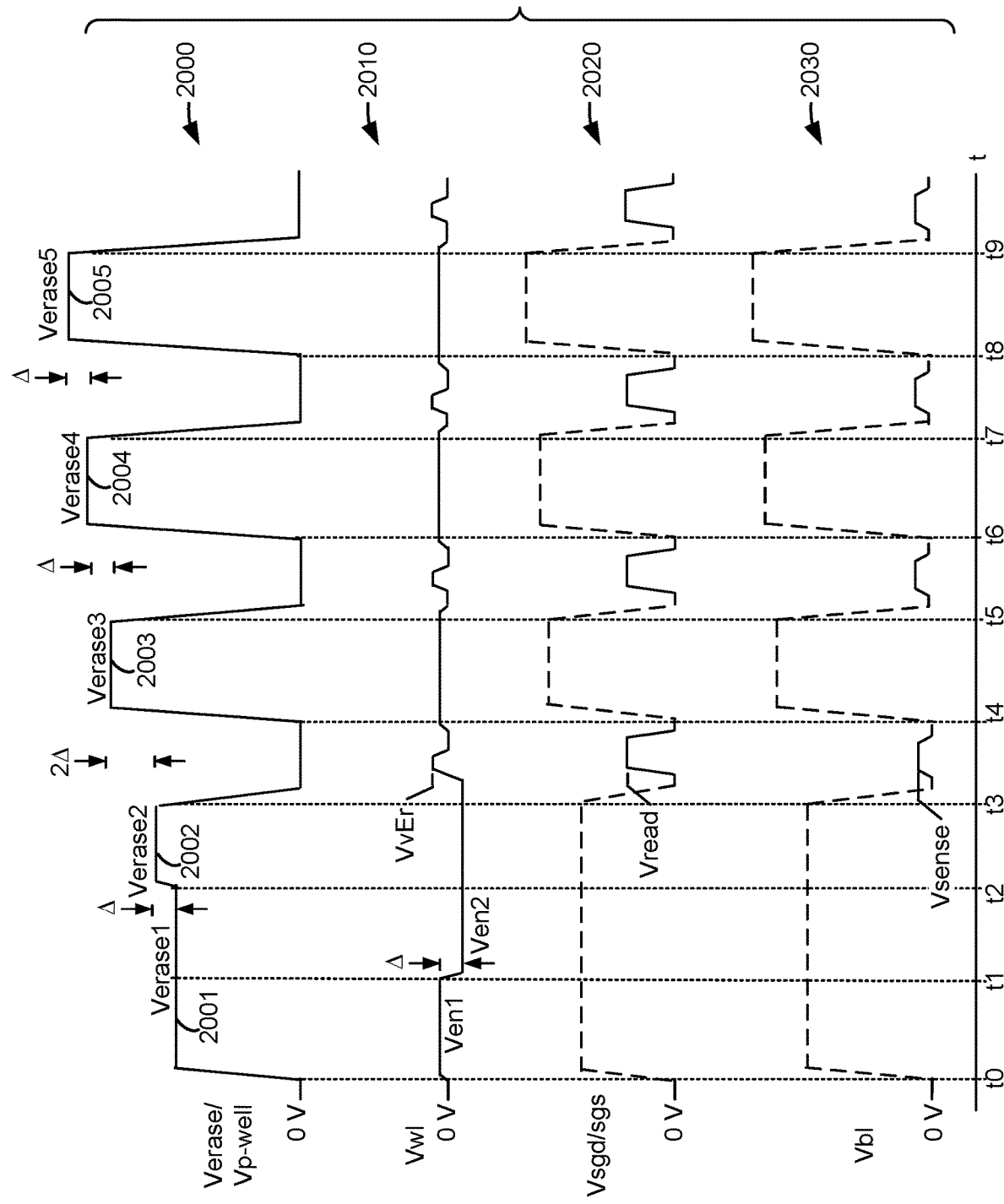

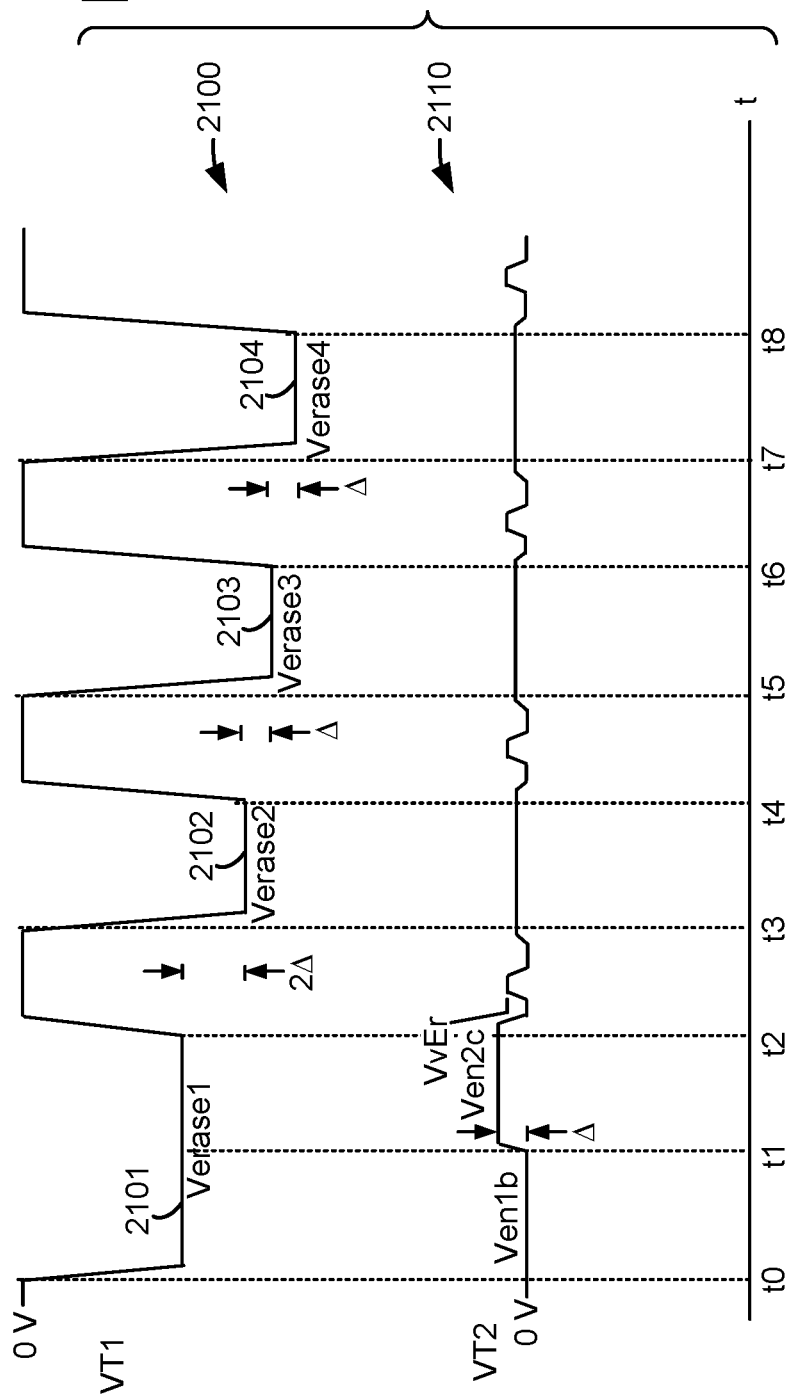

ERASE OPERATION FOR MEMORY DEVICE WITH STAIRCASE WORD LINE VOLTAGE DURING ERASE PULSE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 5B depicts an example cross-sectional view of the block portion of FIG. 5A in the x-y plane at the level of WLn.

FIG. 8A depicts threshold voltage (Vth) distributions for an eight-state memory device.

FIG. 8B depicts a Vth distribution of memory cells during an erase operation after the application of five erase pulses.

FIG. 9 depicts voltage signals in an erase operation, consistent with FIG. 8B, where separate erase pulses are used to provide different channel-to-gate voltages for the memory cells.

FIG. 20 depicts voltage signals in an erase operation, consistent with FIG. 12, where a two-level word line voltage and a two-level erase voltage are used to provide three different channel-to-gate voltages for the memory cells, and the erase voltage is applied to a substrate.

FIG. 21 depicts voltage signals in an erase operation, where a negative voltage VT1 is applied to a first terminal of a memory cell and a non-negative voltage VT2 is applied to a second terminal of the memory cell.

DETAILED DESCRIPTION

Figure 2:
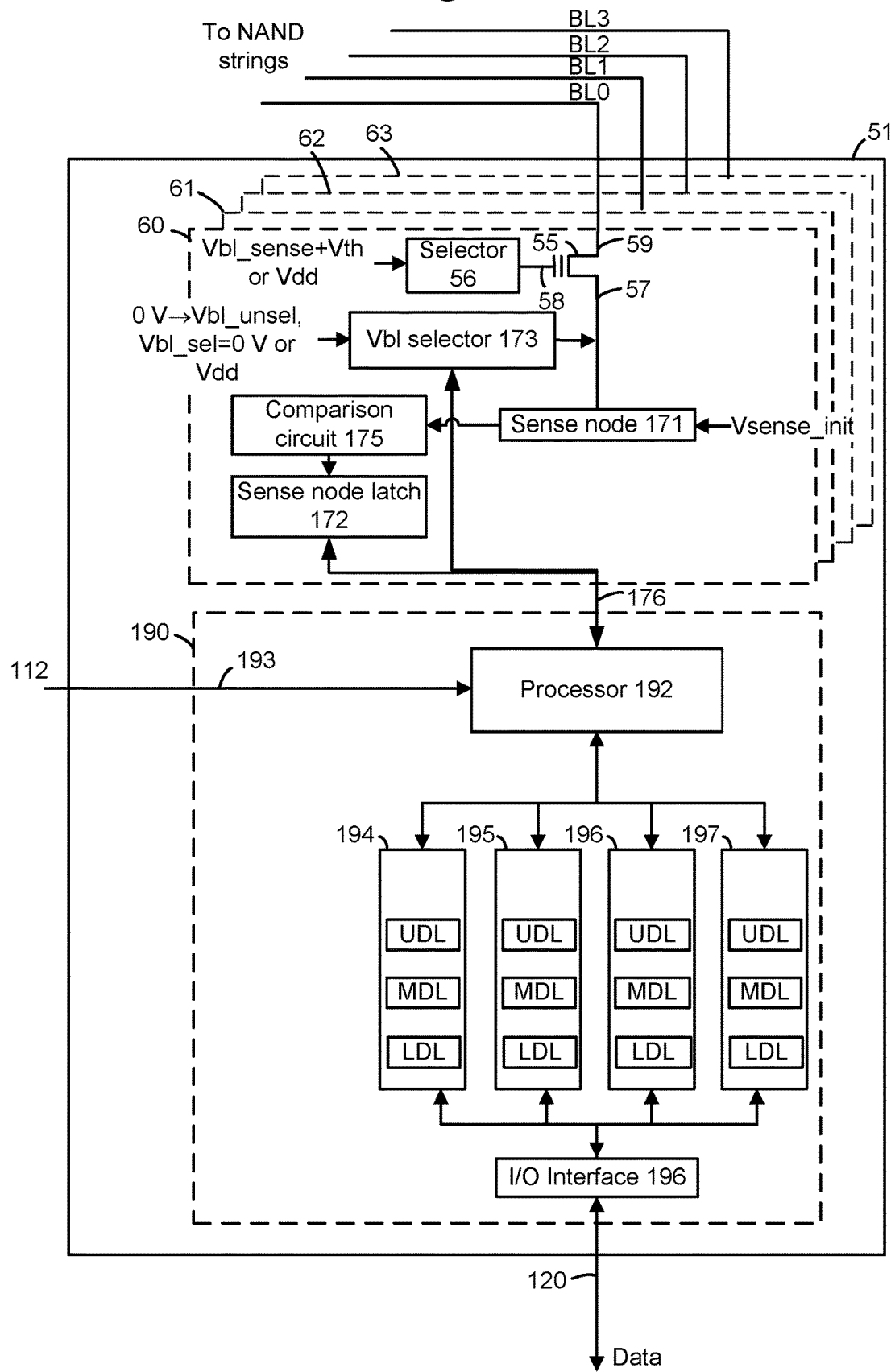
FIG. 2 is a block diagram depicting one embodiment of the sense block 51 of FIG. 1A.

Apparatuses and techniques are described for performing an erase operation for a set of memory cells, where the erase operation applies a staircase or multi-level word line voltage concurrent with a fixed level erase pulse to provide multiple channel-to-gate voltages.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. See FIGS. 6 and 7, for example. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer. See FIGS. 5A and 5B, for example.

In a 2D memory structure, the memory cells may be arranged in horizontal NAND strings on a substrate. See FIG. 6, for example.

The memory cells can be programmed to have a threshold voltage (Vth) which corresponds to a data state. See FIG. 8A, for example. The Vth is a function of an amount of charge stored in a charge storing material of the memory cell. A program operation can include a sequence of program loops, where each program loop is performed by applying a program pulse to a selected word line followed by performing one or more verify tests.

Before being programmed, the memory cells in a block are erased to an erase state. An erase operation involves biasing the memory cells with a relatively large channel-to-gate voltage. In one approach the channels of the NAND strings are charged up by applying an erase pulse to a p-well region in a substrate. The erase pulse causes holes in the p-well to enter the source ends of the NAND strings. In another approach, the erase pulse is applied to the source and/or drain ends of the NAND strings to bias the select gate transistors to generate holes by gate-induced drain leakage. While the channel is charged up, the word line voltages are driven at a low level such as close to 0 V to provide the relatively large channel-to-gate voltage.

Typically, the erase operation involves multiple erase-verify iterations, such as depicted in FIG. 9, where a separate erase pulse is applied in each iteration and is followed by a verify test. The magnitude of the erase pulse can be stepped up by Δ over the different iterations, as depicted by Verase1-Verase5. However, this approach can be time-consuming and result in a spike in current consumption (see FIG. 10) due to the time to ramp up the erase pulse to its peak level in the substrate or bit lines/source lines, which have a relatively high capacitance. One option, depicted in FIG. 11, involves omitting the verify test after the first erase pulse. Instead, a two-level erase pulse is used while the word line voltage remains constant at an erase-enable level (Ven). However, the time and current used in increasing the erase pulse from one level, e.g., Verase1, to a higher level, e.g., Verase2, can still be problematic.

Figure 13:
FIG. 13 depicts voltage signals in an erase operation, consistent with FIG. 12, where a two-level word line voltage, including a positive voltage and a negative voltage, is used to provide two different channel-to-gate voltages for the memory cells, and an erase voltage is applied to a substrate.

Techniques provided herein address the above and other issues. In one approach, an initial part of an erase operation involves applying a fixed erase voltage to a NAND string or other set of memory cells while applying a multi-level word line voltage to the memory cells. This approach provides multiple channel-to-gate voltages which are equivalent to charging up the channel to different levels using erase pulses with different magnitudes. For example, FIG. 13 depicts a word line voltage, Vwl, at a first erase-enable level, Ven1, and a lower second erase-enable level, Ven2, while an erase pulse at a fixed level of Verase1 is applied to the substrate. The word line voltage can be transitioned directly from the first erase-enable level to the second erase-enable level, without performing a verify test. The omitting of the verify test in the initial part of an erase operation is not problematic when several erase pulses are required to complete the erase operation. A subsequent part of the erase operation can involve erase-verify iterations, where an erase pulse is applied followed by performing a verify test.

In one option, such as depicted in FIG. 13, the first erase-enable level is non-negative and the second erase-enable level is negative. In this case, a difference (Δ) between the first and second erase-enable levels of the word line is equal to about one-half of the difference (2Δ) between a first erase pulse (Verase1) and a second erase pulse (Verase2) in the erase operation. This ensures that the channel-to-gate voltage increases in approximately fixed increments through the erase operation.

Figure 15:
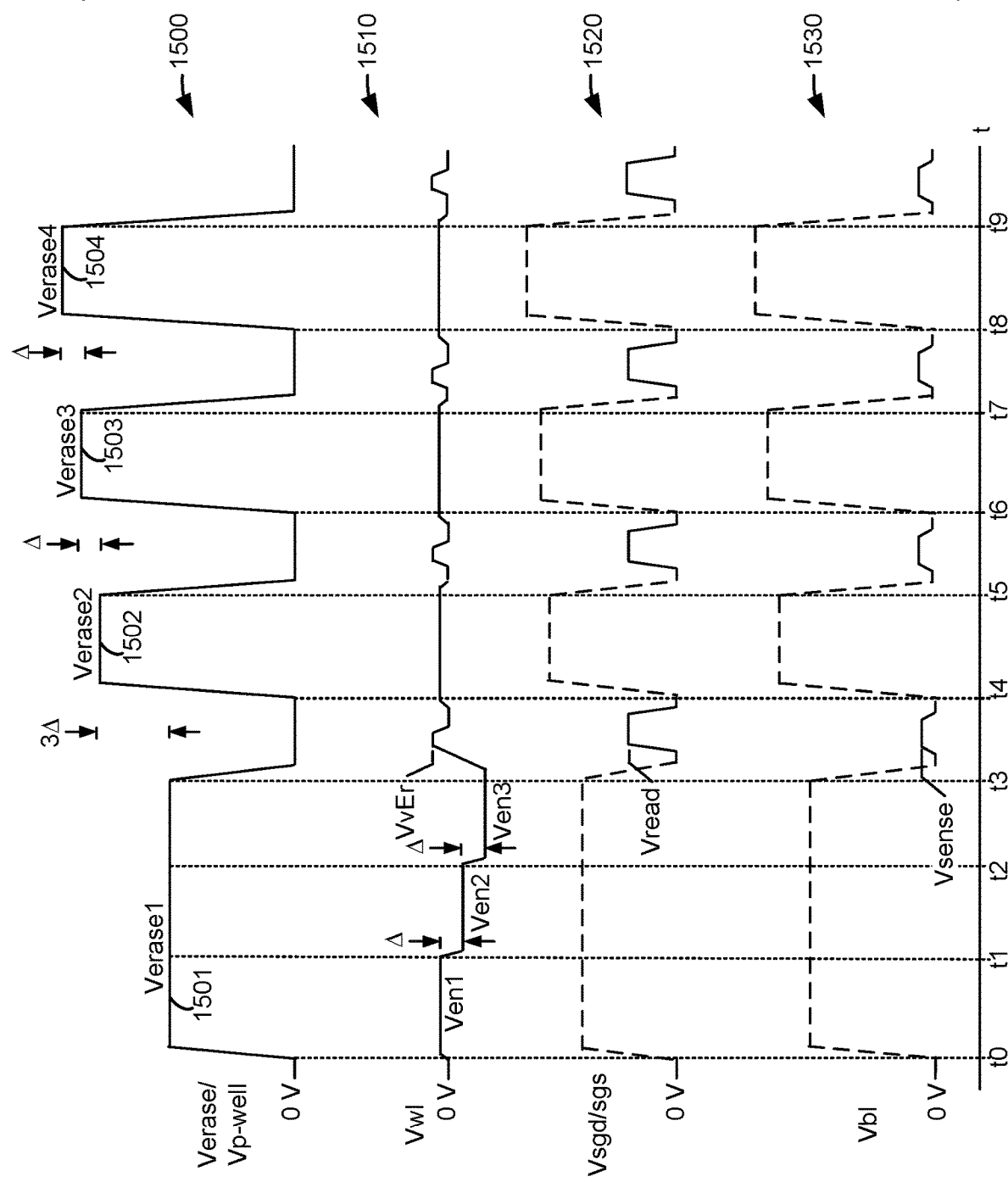
FIG. 15 depicts voltage signals in an erase operation, consistent with FIG. 12, including step 1203a, where a three-level word line voltage, including a positive voltage and two negative voltages, is used to provide three different channel-to-gate voltages for the memory cells.

In another option, such as depicted in FIG. 15, the multi-level word line voltage comprise three erase-enable levels, Ven1-Ven3. in this case, a difference (Δ) between the first and second erase-enable levels of the word line is equal to about one-third of the difference (3Δ) between a first erase pulse (Verase1) and a second erase pulse (Verase2) in the erase operation. This ensures that the channel-to-gate voltage increases in fixed increments through the erase operation.

Figure 18:
FIG. 18 depicts voltage signals in an erase operation, similar to FIG. 13, but where the two levels of the word line voltage are non-negative.

In another option, such as depicted in FIG. 18, the first erase-enable level and the second erase-enable level are both non-negative.

Figure 19:
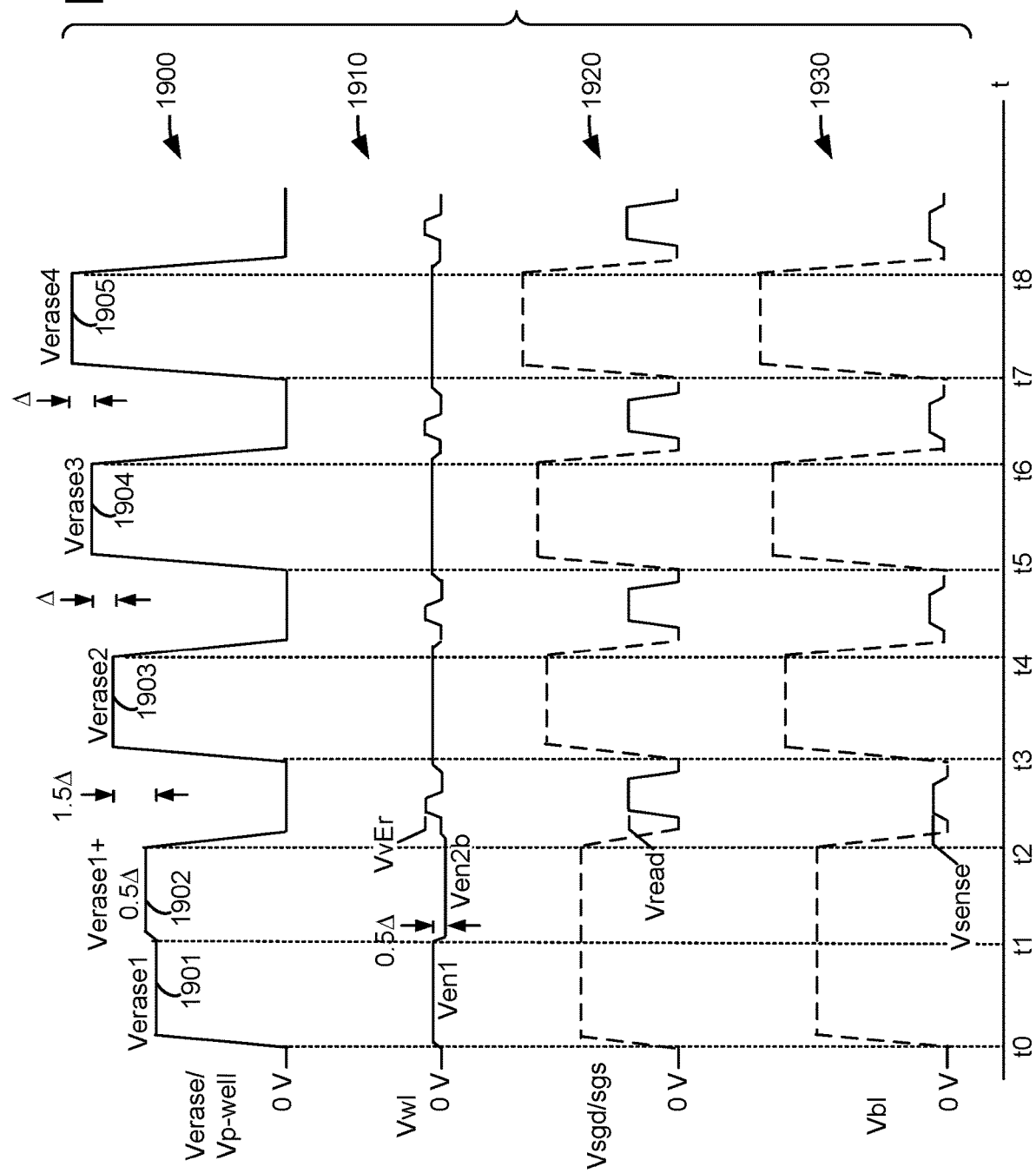
FIG. 19 depicts voltage signals in an erase operation, consistent with FIG. 12, including step 1203b, where a two-level word line voltage and a two-level erase voltage are used to provide two different channel-to-gate voltages for the memory cells, and the erase voltage is applied to a substrate.

In another option, such as depicted in FIG. 19, both the erase pulses and the word line voltage can have multiple levels which change at the same time.

In another option, such as depicted in FIG. 20, both the erase pulses and the word line voltage can have multiple levels which do not change at the same time.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The control circuitry 110 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. See an example column in FIG. 5A. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130*a* communicates with the memory structure 126 on a separate second die 126*b*. The control circuit may communicate with the memory structure and the die 126*b* via a memory interface 131, for example, similar to the memory interface 122*d*. Examples of a memory interface (I/F) include the Common Flash Memory Interface of JEDEC. The techniques described herein can be implemented with a control die 130*a* bonded to one or more memory die 126*b*, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 7, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vsense+Vth, e.g., 1.5 V, to the control gate of the transistor 55 to provide Vsense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a scan operation, or flipped from 0 to 1 in a fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
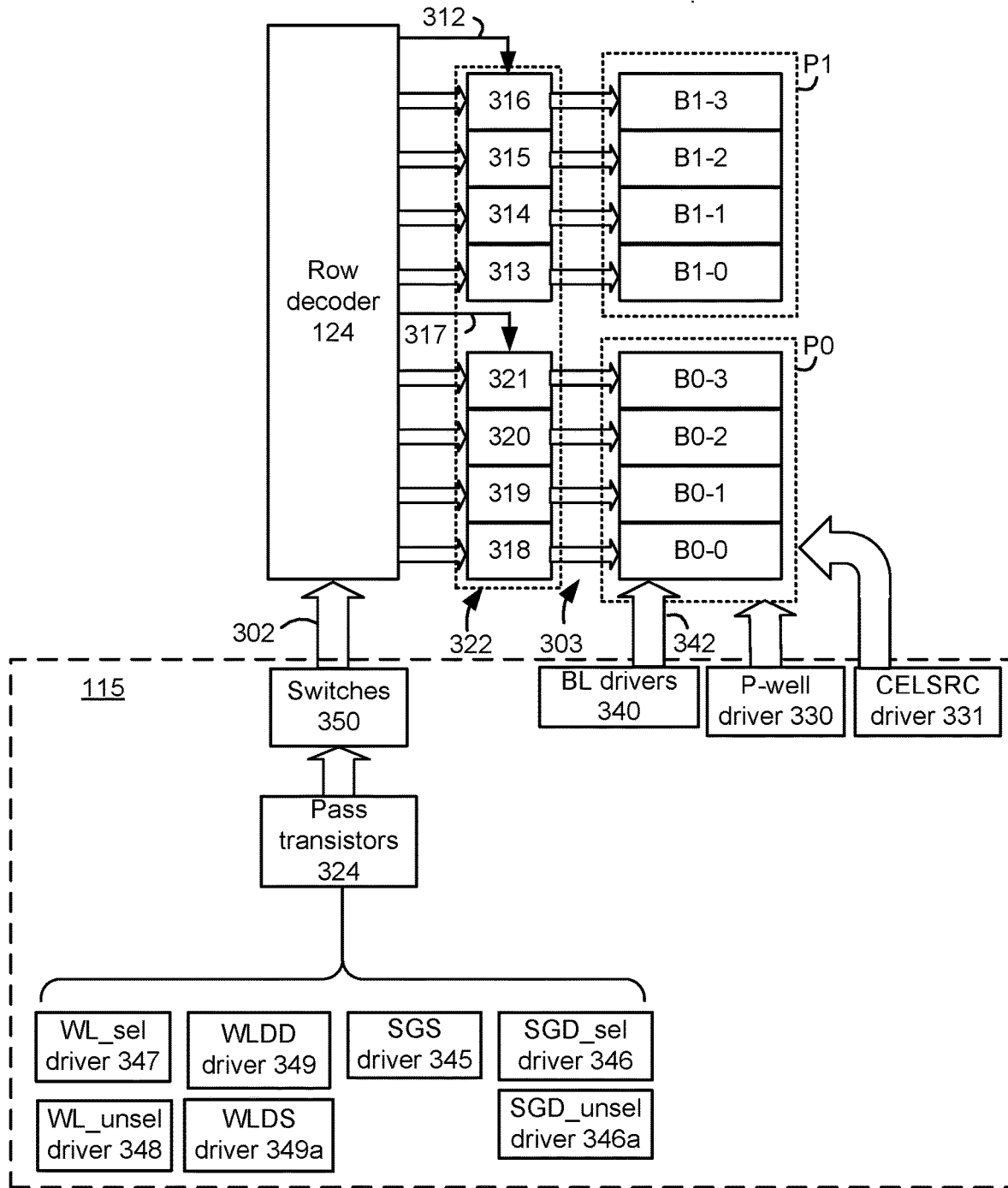
FIG. 3 depicts an example implementation of the power control circuit 115 of FIG. 1A for providing voltages to blocks of memory cells.
Figure 7:
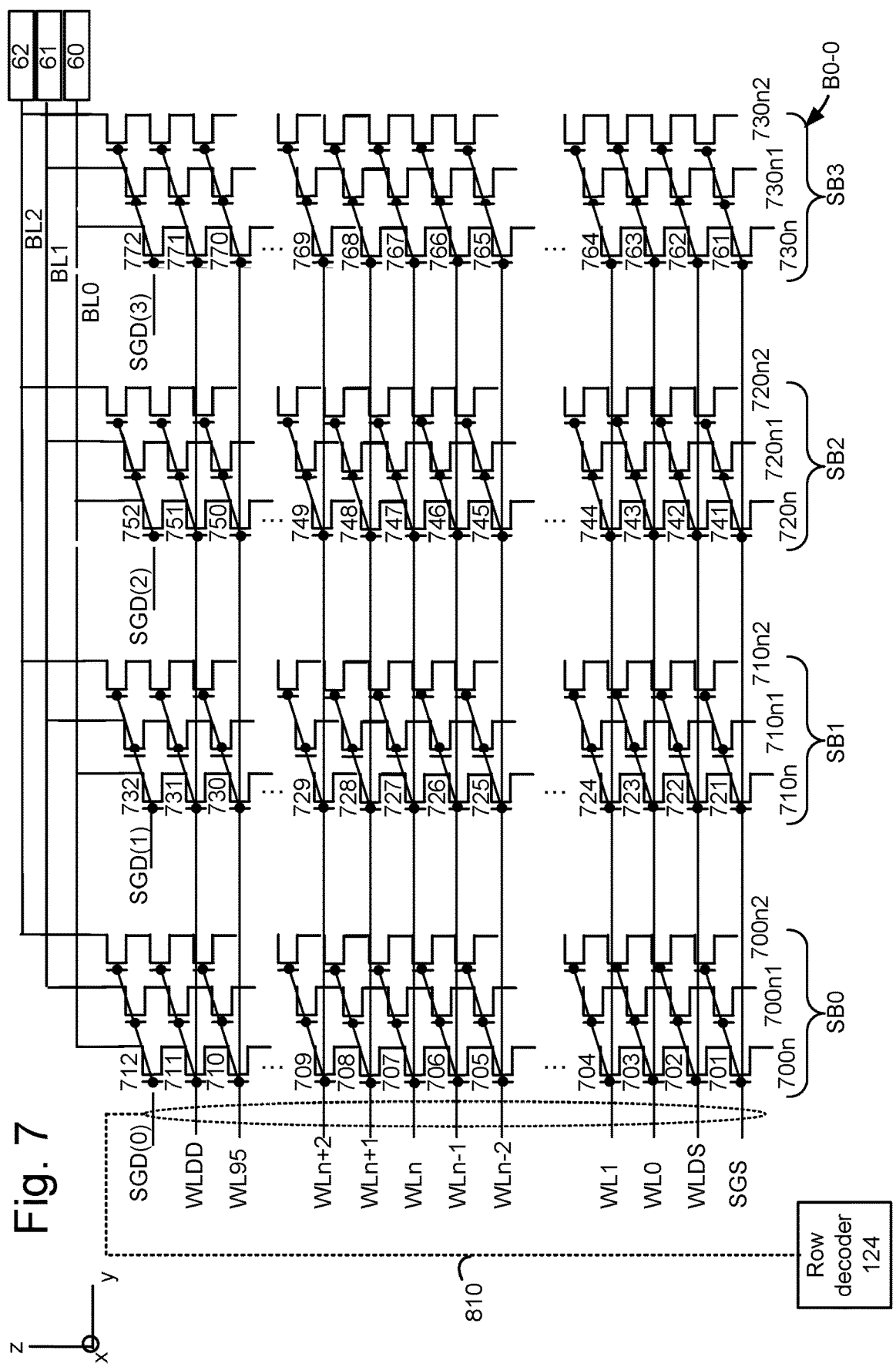
FIG. 7 depicts an example view of the block B0-0 of FIG. 4, with respective NAND strings arranged in sub-blocks, along with associated bit lines and sense circuits.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 7. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a block enable line 312 is connected to sets of pass transistors 313-316, which in turn are connected to select gate and word lines of B1-0 to B1-3, respectively. A block enable line 317 is connected to sets of pass transistors 318-321, which in turn are connected to select gate and word lines of B0-0 to B0-3, respectively. The control signal on the block enable line 317 is therefore an enable signal for a set of blocks B0-0 to B0-3, and the control signal on the block enable line 312 is an enable signal for a set of blocks B1-0 to B1-3.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. In one approach, the WL_unsel driver 348 provides a common voltage signal on each of unselected data word lines. In another approach, multiple drivers can be used to provide different voltage signals on different groups of unselected word lines.

In some cases, additional drivers are provided for the WLn−1 and WLn+1, the adjacent word lines of WLn.

Dummy word line drivers are also provided. The WLDD driver 349 provides a voltage signal on the drain-side dummy word line, WLDD, and the WLDS driver 349*a* provides a voltage signal on the source-side dummy word line, WLDS.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346*a* for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 524 in the p-well region 592, e.g., via the conductive path 524*a*. See FIG. 5A. In one approach, the p-well region 592 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 523 in the p-well region 592, e.g., via the local interconnect 523*a* (source line) in FIG. 5A.

Bit line voltage drivers 340 include voltage sources which provide voltages to the bit lines 342. The bit line voltage for sensing can be 0.5 V, for example.

Figure 4:
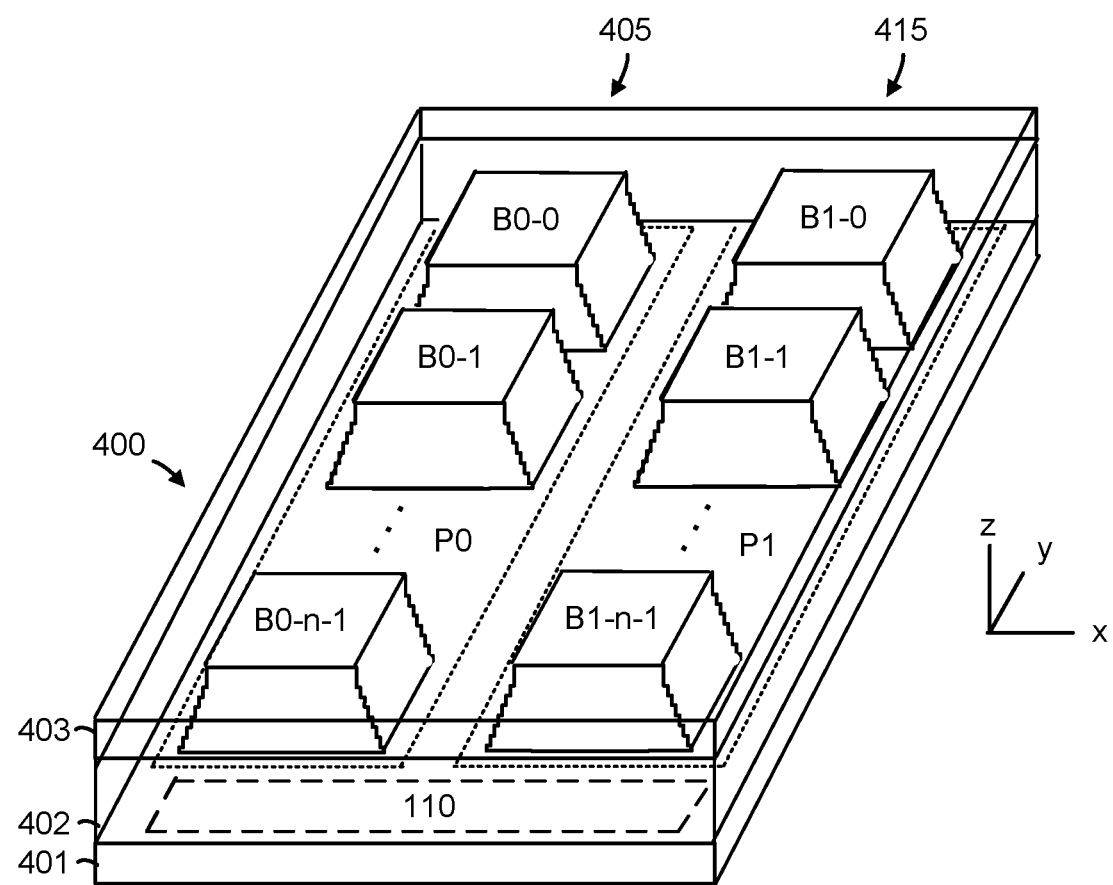
FIG. 4 is a perspective view of an example memory die 400 in which blocks are provided in respective planes P0 and P1, consistent with FIG. 3.

FIG. 4 is a perspective view of an example memory die 400 in which blocks are provided in respective planes P0 and P1, consistent with FIG. 3. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first block sequence 405 of a number n blocks, labelled B0-0 to B0-$n$−1, are formed in P0, and a second block sequence 415 of a number n blocks, labelled B1-0 to B1-$n$−1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erased concurrently.

The substrate 401 can also carry circuitry under the blocks, and one or more lower metal layers which are patterned in conductive paths to carry signals of the circuitry.

Figure 5A:
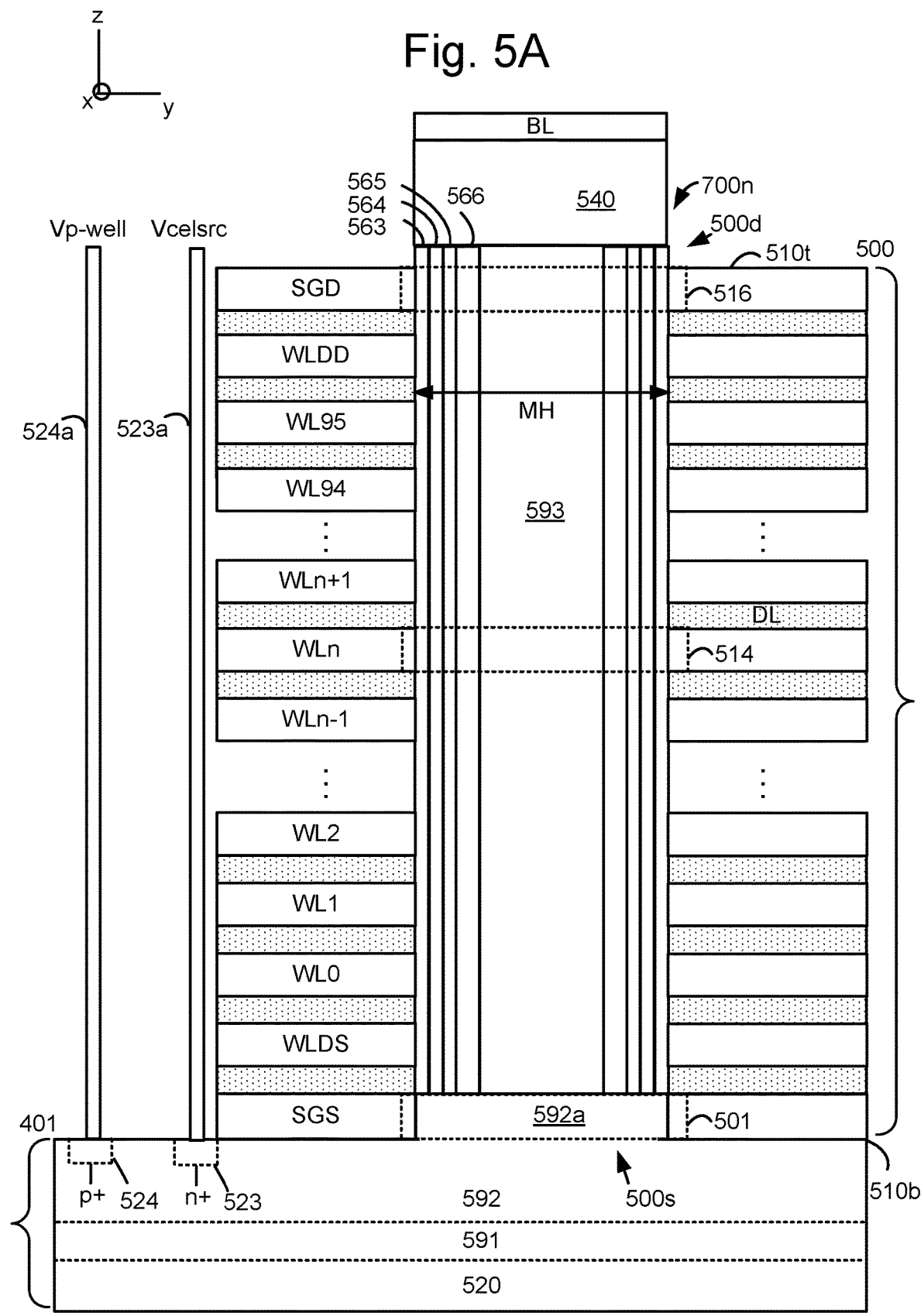
FIG. 5A depicts an example cross-sectional view of a portion of the block B0-0 of FIG. 4, including a NAND string 700n.

In this example, the memory cells are formed in vertical NAND strings in the blocks, consistent with FIG. 5A. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

FIG. 5A depicts an example cross-sectional view of a portion of the block B0-0 of FIG. 4, including a NAND string 700*n*. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . , WLn−1, WLn, WLn+1, . . . , WL94, WL95, WLDD and SGD. WLn denotes a selected word line for a read or program operation. The dielectric layers are shown by a dotted pattern and include an example dielectric layer DL. The conductive layers extend in a memory hole MH (see also FIG. 5B).

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 510t and bottom 510b of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WLn intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 connected to the source ends of the NAND strings. The p-well region may comprise an epitaxial region 592a which extends upward adjacent to the SGS layer. The p-well region can include an n+ contact 523 connected to a local interconnect 523a (a conductive path or source line) for receiving Vcelsrc, and a p+ contact 524 connected to a conductive path 524a for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n has a source end 500s at a bottom 510b of the stack 500, connected to the p-well. The NAND string 500n also has a drain end 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

FIG. 5B depicts an example cross-sectional view of the block portion of FIG. 5A in the x-y plane at the level of WLn. The layers of the NAND string 700n are depicted, including the blocking oxide layer 563, charge-trapping layer 564, tunneling layer 565 and the channel layer 566. The dielectric core 593 is also depicted.

Figure 6:
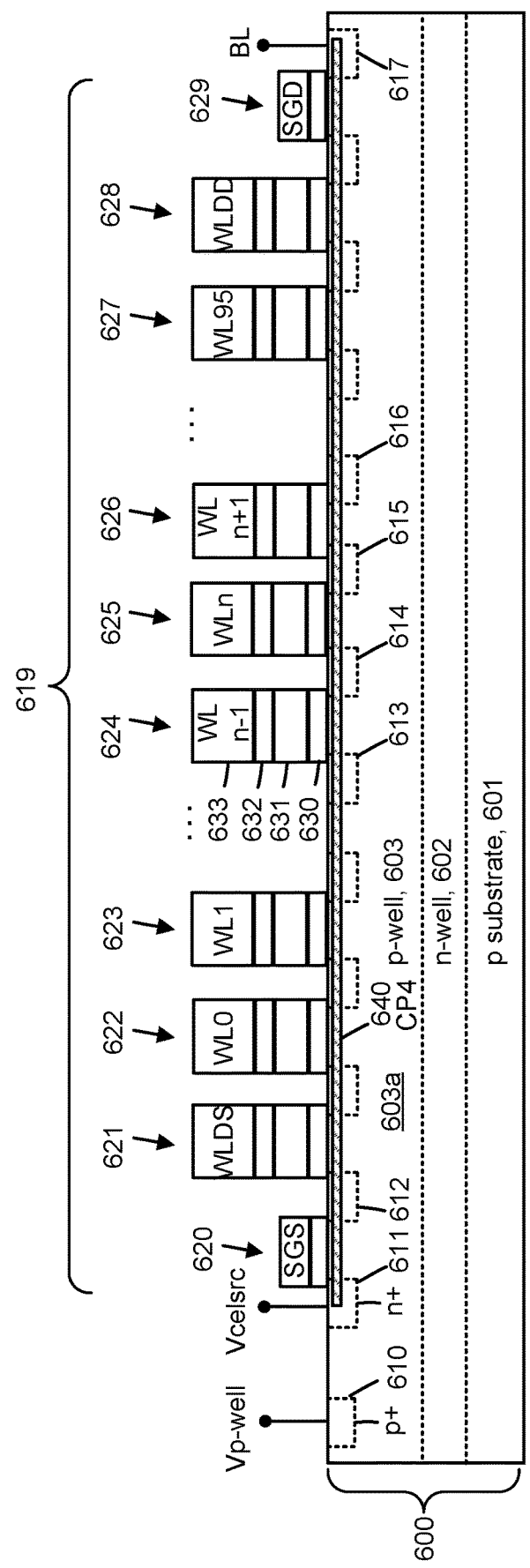
FIG. 6 depicts an example NAND string in a 2D configuration.

FIG. 6 depicts an example NAND string in a 2D configuration. The erase techniques discussed herein can be used in a 2D memory device as well as the above-described 3D memory device. The channel in a 2D memory device extends horizontally in the substrate rather than in a vertically extending channel layer. In this example, a substrate 600 includes a p-well 603 within an n-well 602, which in turn is in a p substrate 601. Vp-well and Vcelsrc are provided to the p-well via contacts 610 and 611, respectively. The contact 611 is a source line. The erase pulse can be Vp-well. A NAND string 619 is arranged on the substrate and include select gate transistors and memory cells. For example, the NAND string includes a SGS transistor 620, memory cells 621, 622 and 623 connected to WLDS, WL0 and WL1, respectively, memory cells 624, 625 and 626 connected to WLn−1, WLn and WLn+1, respectively, memory cells 627 and 628 connected to WL95 and WLDD, respectively, and a SGD transistor 629. Doped regions in the substrate, such as example doped regions 611-617, act as sources and drains of the transistors. Vbl is provided to the doped region 617. When appropriate voltages are provided to the NAND string, an inversion layer or channel 640 is formed in the p-well. A remaining portion 603a of the p-well is biased at Vp-well.

The example memory cell 624 comprises a tunneling layer 630, a floating gate layer 631, a blocking oxide layer 632 and a control gate 633.

FIG. 7 depicts an example view of the block B0-0 of FIG. 4, with respective NAND strings arranged in sub-blocks, along with associated bit lines and sense circuits. The set of word lines WL0-WL95 are connected to memory cells arranged in NAND strings. The NAND strings are arranged in sub-blocks of the block in a 3D configuration. The block is consistent with FIGS. 5A and 5B. Each sub-block SB0-SB3 includes multiple NAND strings. Three example NAND strings are depicted, as a simplification. For example, SB0 comprises NAND strings 700n, 700n1 and 700n2, SB1 comprises NAND strings 710n, 710n1 and 710n2, SB2 comprises NAND strings 720n, 720n1 and 720*n*2, and SB3 comprises NAND strings 730*n*, 730*n*1 and 730*n*2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. In one option, referred to as a regular programming order, the word line programming order may start at WL0, the source end word line and end at WL95, the drain end word line, for example. In another option, referred to as a reverse programming order, the programming starts from the highest word line, e.g., WL95, and ends at the lowest word line, e.g., WL0. This option can provide reduced neighbor word line interference.

Reading can occur for memory cells connected to a selected word line in a selected sub-block. Reading can occur one sub-block at a time.

In an erase operation, typically the entire block is erased, although a partial block erase is also possible. In one approach, an erase-verify test is performed for the entire block. In another approach, an erase-verify test is performed for one sub-block in a block.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700*n* includes an SGS transistor 701, a dummy memory cell 702, data memory cells 703-710, a dummy memory cell 711 and an SGD transistor 712. The NAND string 710*n* includes an SGS transistor 721, a dummy memory cell 722, data memory cells 723-730, a dummy memory cell 731 and an SGD transistor 732. The NAND string 720*n* includes an SGS transistor 741, a dummy memory cell 742, data memory cells 743-750, a dummy memory cell 751 and an SGD transistor 752. The NAND string 730*n* includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700*n*, 710*n*, 720*n* and 730*n* in SB0-SB3, respectively, BL1 is connected to NAND strings 700*n*1, 710*n*1, 720*n*1 and 730*n*1 in SB0-SB3, respectively, and BL2 is connected to NAND strings 700*n*2, 710*n*2, 720*n*2 and 730*n*2 in SB0-SB3, respectively. Each bit line is also connected to a respective sense circuit, consistent with the sense circuits of FIG. 2. For example, BL0-BL2 are connected to sense circuits 60-62, respectively.

The row decoder 124 is at one side of the block in this example, in a peripheral area of the substrate, consistent with the control circuitry 110 depicted in FIG. 4. The row decoder routes voltage signals to the word line via conductive paths 810. In one approach, the conductive paths extend vertically in the z direction to the upper region 403, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3.

FIG. 8A depicts threshold voltage (Vth) distributions for an eight-state memory device. Eight data states, or three bits per cell, are depicted as an example. The techniques herein can apply to other modes, including one or more bits per cell. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution of plot 900 is obtained, representing the erased state. The erase operation is completed when the Vth of all, or nearly all, of the memory cells is below a verify voltage of VvEr. See also FIG. 8B.

The memory cells are then subject to a programming operation. Each of the memory cells will have an assigned data state. Some of the memory cells are assigned to the erased state, as represented by Vth distribution 800, and are not programmed. Most of the memory cells are programmed to higher states, such as A-F, in this example, as represented by Vth distributions 801-807, respectively. These memory cells are subject to verify tests using verify voltages of VvA-VvG.

In a read operation, the memory cells can be read by applying the read voltages VrA-VrG applied to the selected word line. The data which is programmed or read can be arranged in pages. In one approach, one page of data is read at a time. For example, with eight data states a lower page of data can be read using VrA and VrE, a middle page of data can be read using VrB, VrD and VrF, and an upper page of data can be read using VrC and VrG.

FIG. 8B depicts a Vth distribution of memory cells during an erase operation after the application of five erase pulses. The Vth distributions 810-814 are obtained after first through first erase pulses, respectively. An erase operation has the opposing goals of lowering the Vth quickly to save time, while also avoiding over-erase. These goals can be achieved by erasing the memory cells using a few erase pulses. The erase pulses can be stepped up in magnitude as the erase operation proceeds, as depicted in examples further below. More generally, the channel-to-gate voltage can be stepped up in magnitude as the erase operation proceeds.

The Vth distribution 814 represents the case where the erase operation is completed since the Vth of all, or nearly all, of the memory cells is below VvEr.

FIG. 9 depicts voltage signals in an erase operation, consistent with FIG. 8B, where separate erase pulses are used to provide different channel-to-gate voltages for the memory cells. In this example, the erase pulses are applied to the substrate to charge up the NAND string channels by hole injection. In other examples, the erase pulses are applied to the bit lines and/or source lines to charge up the NAND string channels by gate-induced drain leakage. This example also uses separate erase pulses, each having a respective fixed magnitude, and performs an erase-verify test after each erase pulse. Further, a common verify test is performed for all word lines.

A plot 900 depicts Verase, which is the same as Vp-well. This plot represents erase pulses 901-905 with magnitudes of Verase1-Verase5, respectively. Each pulse after the first pulse is stepped up by a fixed amount of Δ relative to the prior erase pulse. The channel voltage corresponds to Verase.

A plot 910 depicts Vwl, the word line voltage. Vwl is set to an erase-enable voltage, Ven, such as 0-0.5 V, during each erase pulse, and to an erase-verify voltage, VvEr between the erase pulses. An erase-verify test is performed during the erase-verify voltage.

A plot 920 depicts Vsgd and Vsgs, the voltages of the SGD and SGS transistors, respectively. These voltages can be floated (as denoted by the dashed lines) during the erase pulses so that they increase when the erase pulse is applied and the channel is charged up. During the erase-verify tests, these voltages are set to a read pass level, Vread, to allow sensing of the memory cells.

A plot 930 depicts Vbl, the bit line voltage. This voltage can be floated during the erase pulses so that it increases when the erase pulse is applied and the channel is charged up. During the erase-verify tests, Vbl is set to a sense level, Vsense, to allow sensing of the memory cells.

In some cases, one or more blocks are erased in a plane while one or more other blocks are inhibited from being erased, where all of the blocks are on a common p-well. The word line voltages can be floated in the inhibited blocks.

Figure 10:
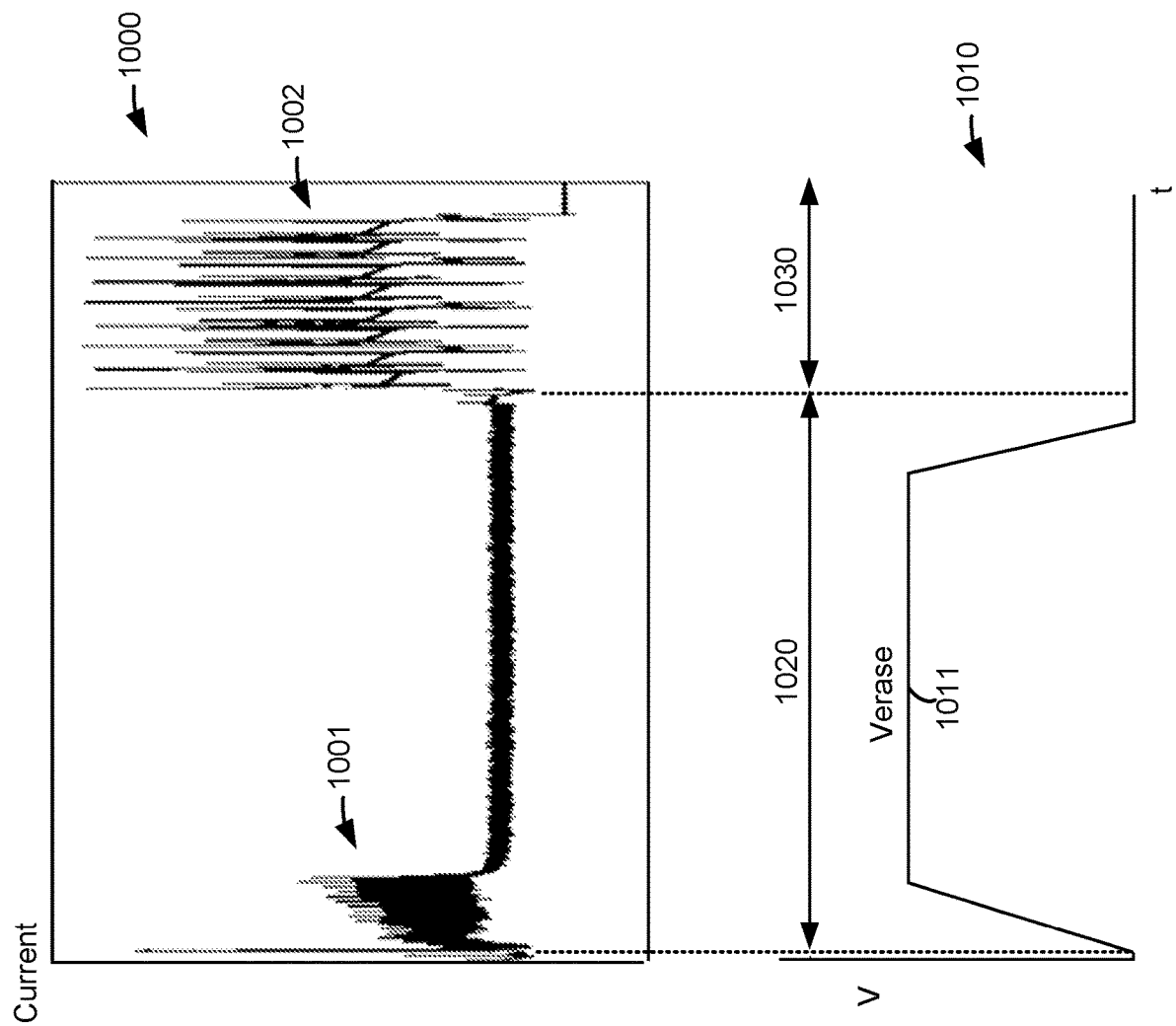
FIG. 10 depicts a plot 1000 of current consumption versus time and a plot 1010 of erase voltage versus time, during an erase pulse 1011 which is followed by erase-verify tests.

FIG. 10 depicts a plot 1000 of current consumption versus time and a plot 1010 of erase voltage versus time, during an erase pulse 1011 which is followed by erase-verify tests. This example shows how current consumption increases during an erase pulse and verify tests. The time period 1020 represents the erase portion of an erase-verify iteration in which an erase pulse 1011, Verase, is applied to the substrate or bit lines and/or source lines. The plot 1001 shows that the current increases as the voltage increase to the peak level of Verase. The time period 1030 represents the verify portion of the erase-verify iteration in which erase-verify voltages are applied to the word lines. The plot 1002 shows that the current increases during each of eight erase-verify tests. This example is consistent with FIG. 17, where separate erase-verify tests are performed for even- and odd-numbered word lines, for each of four sub-blocks of a block.

The techniques herein reduce the number of separate erase pulses to reduce the erase time as well as to reduce current consumption.

Figure 11:
FIG. 11 depicts voltage signals in an erase operation, consistent with FIG. 8B, where a two-level erase pulse is used to provide two different channel-to-gate voltages for the memory cells.

FIG. 11 depicts voltage signals in an erase operation, consistent with FIG. 8B, where a two-level erase pulse is used to provide two different channel-to-gate voltages for the memory cells. This approach can save time and reduce current consumption since the second erase pulse at Verase2 is provided by increasing the voltage from the level of the first erase pulse at Verase1, rather than providing a separate erase pulse which increases from a lower level such as 0 V to Verase2. The erase-verify test which would occur between the first two erase pulses is omitted. As a result, the time to reduce the voltage from the erase level to 0 V, perform the verify test and increase the erase voltage back to a peak level is avoided. However, there is still a time and current consumption penalty in increasing the erase pulse from Verase1 to Verase2.

A plot 1100 depicts Verase, which is the same as Vp-well. This plot includes a two-level erase pulse 1101a which includes erase pulses 1101 and 1102. Plots 1103-1105 represent erase pulses at Verase3-Verase5, respectively. Verase2 is stepped up from Verase1 by Δ. Each successive erase pulse is also stepped up by the fixed amount of Δ in this example. The erase pulses can range from 15-25 V as an example.

A plot 1110 depicts Vwl. Vwl is set to Ven during each erase pulse, and to VvEr between the erase pulses. An erase-verify test is performed during the erase-verify voltage.

A plot 1120 depicts Vsgd and Vsgs. These voltages can be floated during the erase pulses and set to Vread during the erase-verify tests.

A plot 1130 depicts Vbl. Vbl can be floated during the erase pulses and set to Vsense during the erase-verify tests.

Figure 12:
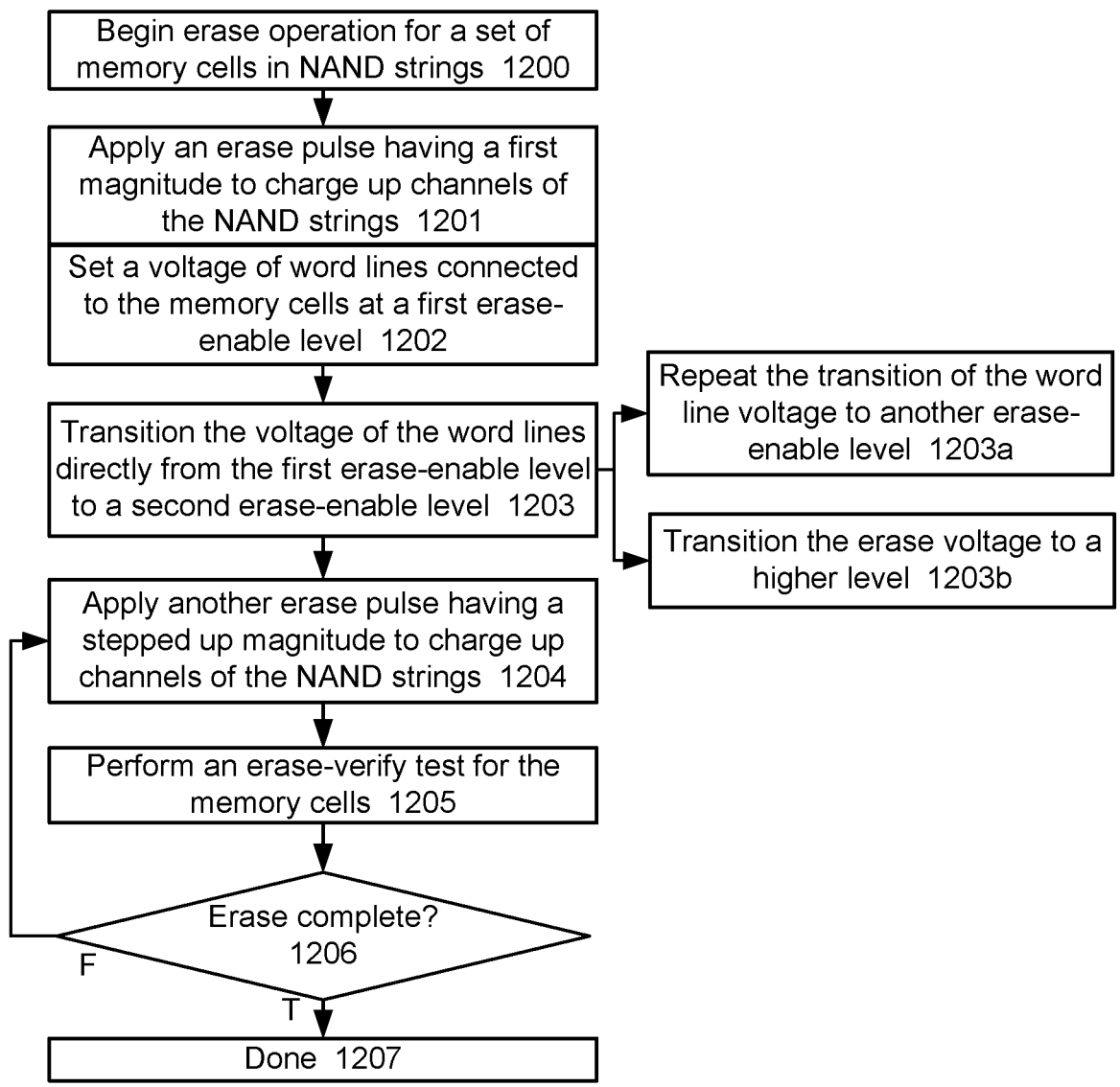
FIG. 12 depicts a flowchart of an example erase operation which provides different channel-to-gate voltages for memory cells by adjusting an erase-enable voltage of a word line.

FIG. 12 depicts a flowchart of an example erase operation which provides different channel-to-gate voltages for memory cells by adjusting an erase-enable voltage of a word line. This operation can avoid the time and current consumption penalty of other approaches such as in FIGS. 9 and 11.

Step 1200 begins an erase operation for a set of memory cells in NAND strings. Although NAND strings are mentioned in this example, the erase techniques provided herein are applicable to other arrangements of memory cells. Also, while memory cells with channels are mentioned in this example, the erase techniques provided herein are applicable to other types of memory cells, including those with opposing first and second terminals, T1 and T2, respectively. See FIG. 21.

Step 1201 includes applying an erase pulse having a first magnitude, e.g., Verase1, to charge up channels of the NAND strings. At the same time, step 1202 includes setting a voltage of word lines connected to the memory cells at a first erase-enable level, e.g., Ven1. Step 1203 includes transitioning the voltage of the word lines directly from the first erase-enable level to a second erase-enable level, Ven2. For example, see the transition at t1 in FIG. 13-21. In one approach, step 1203a includes an option of repeating the transition of the word line voltage to another erase-enable level. For example, FIG. 15 depicts a first transition from Ven1 to Ven2 and a second transition from Ven2 to Ven3. Step 1203b includes another option of transitioning the erase voltage to a higher level. For example, FIG. 19 depicts a transition from Verase1 to Verase1+0.5Δ, and FIG. 20 depicts a transition from Verase1 to Verase2. Both options could be used.

Step 1204 includes applying another erase pulse having a stepped up magnitude, relative to the prior erase pulse, to charge up the channels of the NAND strings. Step 1205 includes performing an erase-verify test for the memory cells. In one approach, the erase-verify test is performed concurrently for all word lines, as in FIGS. 13-15 and 18-20. In another approach, the erase-verify test is performed separately for even- and odd-numbered word lines, as in FIG. 16. In yet another approach, the erase-verify test is performed separately for even- and odd-numbered word lines, and for each sub-block, as in FIG. 17.

A decision step 1206 determines whether the erase operation is complete. The decision step is true when all, or nearly all of the NAND strings, pass the erase-verify test. In this case, the erase operation is done at step 1207. If the decision step 1206 is false, another erase pulse is applied at step 1204.

In the erase process, the memory cells are subject to increasingly higher channel-to-gate voltages based on the combination of the erase pulse magnitude and the erase-enable voltage. For example, by reducing the erase-enable voltage (the control gate voltage) by Δ and keeping the erase pulse magnitude fixed, the channel-to-gate voltage increases by Δ. In another example, by reducing the erase-enable voltage by 0.5Δ and increasing the erase pulse magnitude by 0.5Δ, the channel-to-gate voltage increases by Δ. This approach is useful since it still results in a savings in time and current consumption. Specifically, it takes less time and current to increase the erase pulse magnitude by 0.5Δ and decrease the erase-enable voltage by 0.5Δ than to increase the erase pulse magnitude by Δ while the erase-enable voltage is fixed. The time and current used to reduce the word line voltage is typically less than for the erase pulse due to the lower capacitance of the word lines compared to the p-well, for example. The stabilization time is reduced as well.

FIG. 13 depicts voltage signals in an erase operation, consistent with FIG. 12, where a two-level word line voltage, including a positive voltage and a negative voltage, is used to provide two different channel-to-gate voltages for the memory cells, and an erase voltage is applied to a substrate. Plots 1300, 1310, 1320 and 1330 depict Verase/Vp-well, Vwl, Vsgd/sgs and Vbl, respectively. From t0-t1, Vwl=Ven1 and from t1-t2, Vwl=Ven2. Ven1 can be a positive voltage or at least a non-negative voltage, while Ven2 is a negative voltage. A negative voltage can be generated on some memory chips such as those which use a triple well process. The erase pulse is fixed at Verase1 from t0-t2 (plot 1301). This time represents an initial erase loop or iteration in the erase operation, where different channel-to-gate voltages are provided when Ven1 and Ven2 are applied.

Ven2 can be less than Ven1 by an amount or delta referred to as Δ. Ven1 and Ven2 are word line voltages which are also control gate voltage of the memory cells. The channel-to-gate voltage when Ven2 is applied is therefore greater than the channel-to-gate voltage when Ven1 is applied by Δ. Since Vwl transitions directly from Ven1 to Ven2 while the erase pulse is applied, the conditions for performing an erase-verify test are not met and no such test is performed from t0-t2. However, an erase-verify test can be performed from t2-t3 when the p-well voltage is returned to a low level such as 0 V and Vwl is set to VvEr.

A direct transition from Ven1 to Ven2, for example, can involve requesting that a voltage driver output Ven1, e.g., 0.5 V, for a period of time, then requesting that the voltage driver output Ven2, e.g., −0.5 V, for another, adjacent period of time. Or, the voltage driver can be requested to output different voltages in a sequence which also provides a direct transition from Ven1 to Ven2, e.g., in a sequence such as 0.5 V, 0 V, −0.5 V.

Subsequently, three erase-verify iterations are performed, as an example. That is, after the initial erase iteration, the erase operation involves performing a plurality of erase-verify iterations. Each erase-verify iteration comprises an erase portion in which an erase pulse is applied to the channel, where a magnitude of the erase pulse is stepped up in successive erase-verify iterations of the plurality of erase-verify iterations, and a verify portion in which the erase-verify test is performed for the memory cell.

For example, each iteration includes an erase pulse 1302-1304 with a peak magnitude of Verase2-Verase4, respectively, at t3-t4, t5-t6 and t7-t8, respectively, and an erase-verify test in which Vwl=VvEr at t4-t5, t6-t7 and after t8. Verase2 can be higher than Verase1 by (2Δ) to provide a channel-to-gate voltage at t3-t4 which is (Δ) higher than at t1-t2. This is because Vwl=Ven1 instead of Ven2 at t3-t4. That is, with Ven higher by Δ, Verase has to be higher by about 2Δ for the channel-to-gate voltage to be higher by Δ.

This assumes the channel voltage, Vch, is the same as Verase, as an approximation. In one approach, a voltage difference (Δ) between the first erase-enable level and the second erase-enable level is 40-60% of a voltage difference (2Δ) between the first magnitude (Verase1) and the second magnitude (Verase2) of the erase pulse.

Vsgd/sgs floats during the erase pulses and is set to Vread during the erase-verify tests. Vbl also floats during the erase pulses and is set to Vsense during the erase-verify tests at t2-t3, t4-t5, t6-t7 and after t8.

Figure 14:
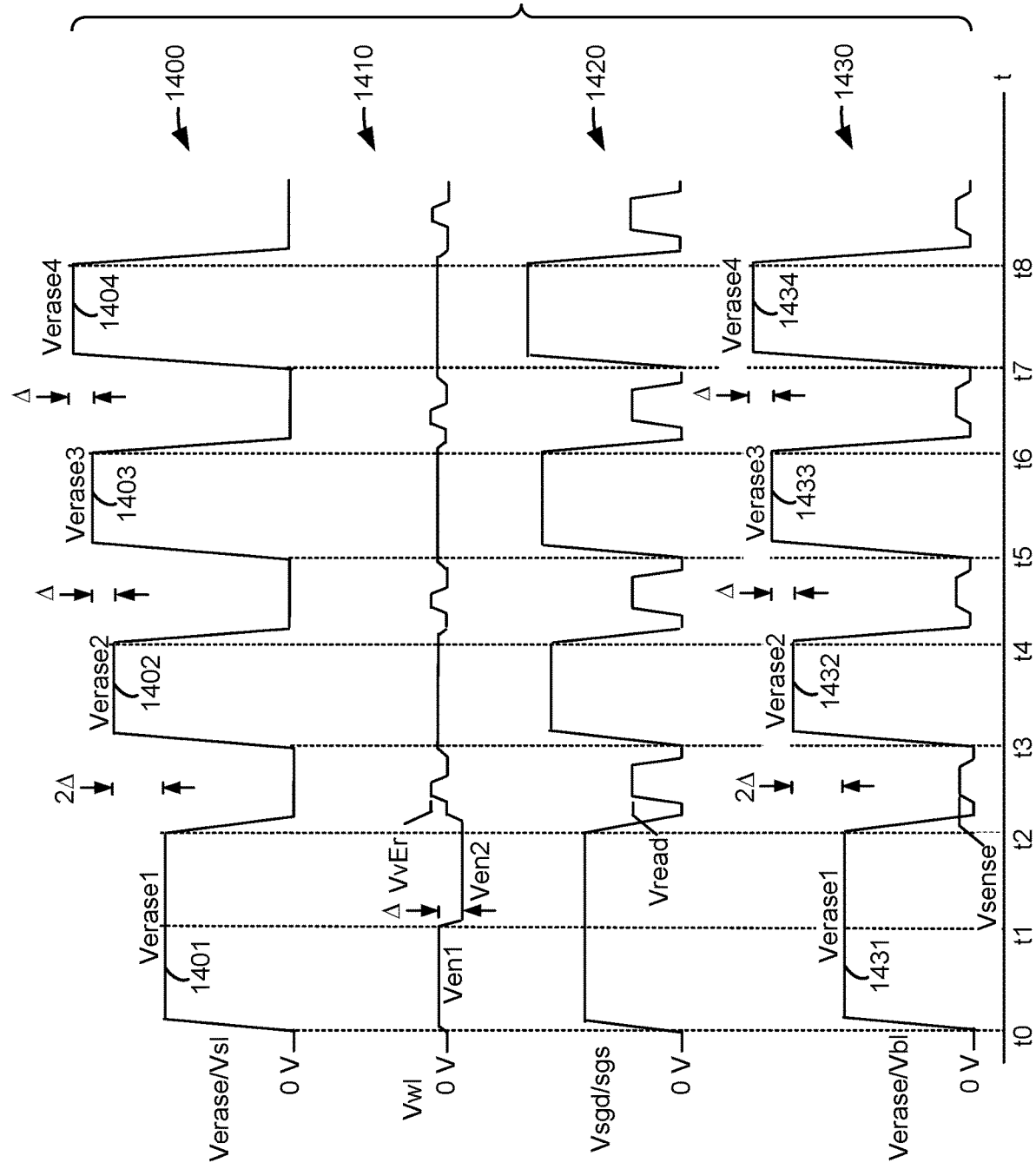
FIG. 14 depicts voltage signals in an erase operation, consistent with FIG. 12, where a two-level word line voltage, including a positive voltage and a negative voltage, is used to provide two different channel-to-gate voltages for the memory cells, and an erase voltage is applied to a bit line and source line.

FIG. 14 depicts voltage signals in an erase operation, consistent with FIG. 12, where a two-level word line voltage, including a positive voltage and a negative voltage, is used to provide two different channel-to-gate voltages for the memory cells, and an erase voltage is applied to a bit line and source line. By applying the erase voltage to the bit line and source line, and biasing the SGD and SGS transistors with a positive voltage which is less than erase voltage, a back bias is provided on these transistors which causes them to generate holes in the channel by gate-induced drain leakage (GIDL). The holes charge up the channel to provide a desired channel-to-gate voltage for erasing. Optionally, GIDL is generated at the SGD or SGS transistors but not at both.

Plots 1400, 1410, 1420 and 1430 depict Verase/Vsl, Vwl, Vsgd/sgs and Vbl, respectively. As in FIG. 13, from t0-t1, Vwl=Ven1 and from t1-t2, Vwl=Ven2. The erase pulse 1401 and 1431 is fixed at Verase1 from t0-t2 on the source line and bit line. A erase-verify test can be performed from t2-t3 when the p-well voltage is returned to a low level such as 0 V, Vwl is set to VvEr and Vbl is set to Vsense.

Subsequently, three erase-verify iterations are performed, as an example. Each iteration includes an erase pulse 1402-1404 and 1432-1434 with a peak magnitude of Verase2-Verase4, respectively, at t3-t4, t5-t6 and t7-t8, respectively, and an erase-verify test in which Vwl=VvEr at t4-t5, t6-t7 and after t8. Regarding the difference between Verase1 and Verase2, with Ven higher by Δ, Verase has to be higher by about 2Δ for the channel-to-gate voltage to be higher by Δ.

Vsgd/sgs floats during the erase pulses and is set to Vread during the erase-verify tests. Vbl also floats during the erase pulses and is set to Vsense during the erase-verify tests.

FIG. 15 depicts voltage signals in an erase operation, consistent with FIG. 12, including step 1203a, where a three-level word line voltage, including a positive voltage and two negative voltages, is used to provide three different channel-to-gate voltages for the memory cells. This approach differs from FIG. 13 in that a third erase-enable voltage, Ven3, is used during the fixed erase pulse at Verase1 (plot 1501). In one approach, Ven3 is lower than Ven2 by a same amount (Δ) by which Ven2 is lower than Ven1. This amount can be the step size for the channel-to-gate voltage in the erase operation. First, second and third channel-to-gate voltages are provided when Ven1, Ven2 and Ven3, respectively, are applied. The next erase pulse, at Verase2 (plot 1502), is stepped up from Verase1 by 3Δ to provide the next uniform step up in channel-to-gate voltage for the memory cells. This is because Vwl=Ven1 instead of Ven3 during Verase2. That is, with Ven higher by 2Δ, Verase has to be higher by about 3Δ for the channel-to-gate voltage to be higher by Δ.

Verase3 (plot 1503) is stepped up from Verase2 by Δ, and Verase4 (plot 1504) is stepped up from Verase3 by Δ.

In one approach, a voltage difference (Δ) between the first erase-enable level and the second erase-enable level is 25-40% of a voltage difference (3Δ) between the second magnitude (Verase2) and the first magnitude (Verase1).

Plots 1500, 1510, 1520 and 1530 depict Verase/Vp-well, Vwl, Vsgd/sgs and Vbl, respectively. Vwl=Ven1, Ven2 and Ven3 from t1-t2, t2-t3 and t3-t4, respectively. The erase pulse (plot 1501) is fixed at Verase1 from t0-t3. An erase-verify test can be performed from t3-t4.

Subsequently, three erase-verify iterations are performed, as an example. Each iteration includes an erase pulse 1502-1504 with a peak magnitude of Verase4-Verase6, respectively, at t4-t5, t6-t7 and t8-t9, respectively, and an erase-verify test at t3-t4, t5-t6, t7-t8 and after t9.

In FIG. 15-20, Vsgd/sgs floats during the erase pulses and is set to Vread during the erase-verify tests. Vbl also floats during the erase pulses and is set to Vsense during the erase-verify tests.

Figure 16:
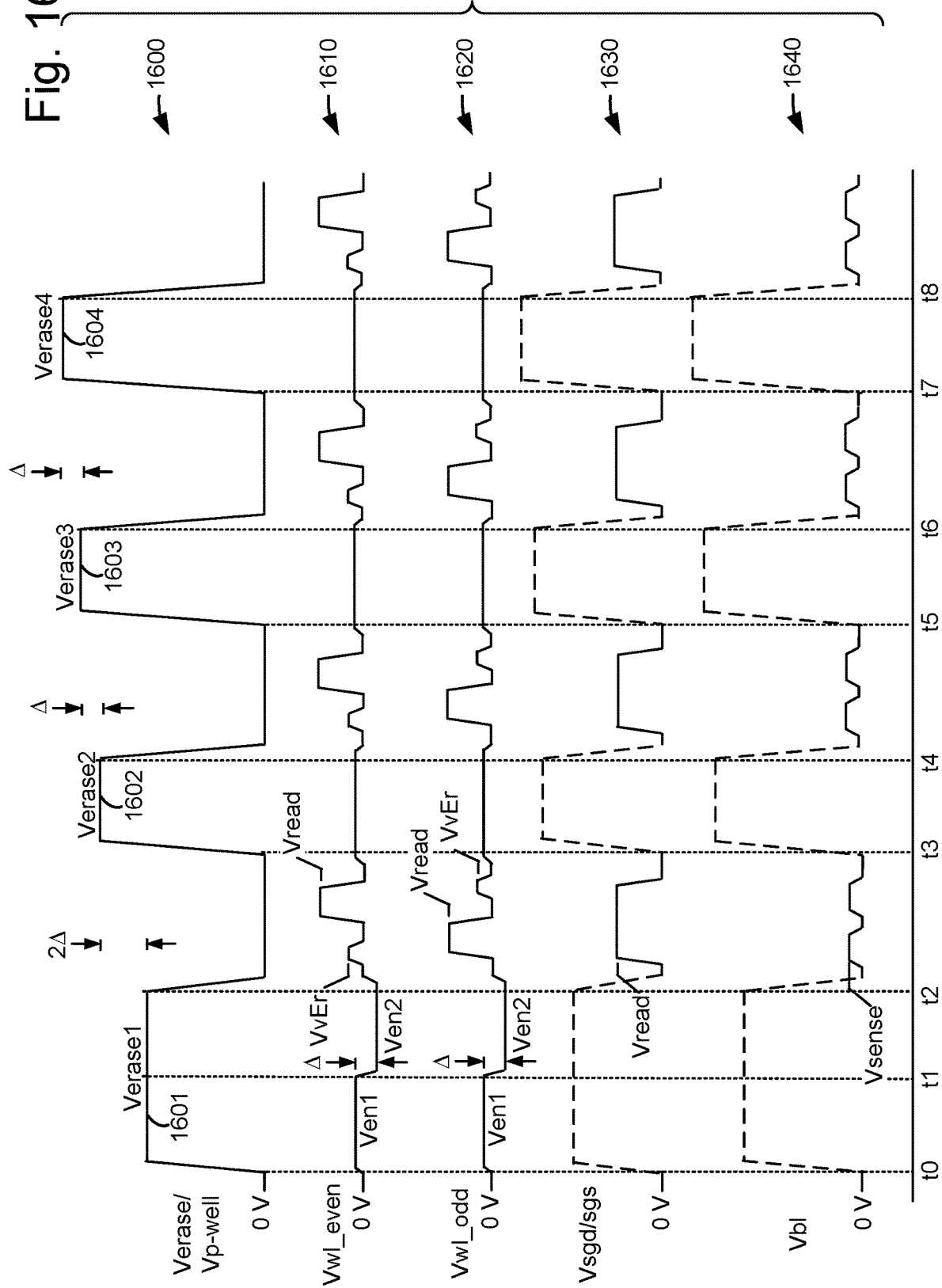
FIG. 16 depicts voltage signals in an erase operation, consistent with FIG. 12, where a two-level word line voltage, including a positive voltage and a negative voltage, is used to provide two different channel-to-gate voltages for the memory cells, and erase-verify operations are performed separately for even- and odd-numbered word lines.

FIG. 16 depicts voltage signals in an erase operation, consistent with FIG. 12, where a two-level word line voltage, including a positive voltage and a negative voltage, is used to provide two different channel-to-gate voltages for the memory cells, and erase-verify operations are performed separately for even- and odd-numbered word lines. This approach is similar to FIG. 13 except for the erase-verify tests.

Plots 1600, 1610, 1620, 1630 and 1640 depict Verase/Vp-well, Vwl_even (the voltage applied to even-numbered word lines, e.g., WL0, WL2 . . . ), Vwl_odd (the voltage applied to odd-numbered word lines, e.g., WL1, WL3 . . . ), Vsgd/sgs and Vbl, respectively. The erase pulse 1601 is fixed at Verase1 from t0-t2. An erase-verify test can be performed for the even-numbered word lines and then the odd-numbered word lines from t2-t3.

Subsequently, three erase-verify iterations are performed, as an example. Each iteration includes an erase pulse 1602-1604 with a peak magnitude of Verase2-Verase4, respectively, at t3-t4, t5-t6 and t7-t8, respectively. An erase-verify test can be performed for the even-numbered word lines and then the odd-numbered word lines from t4-t5, t6-t7 and after t8. When the erase-verify test is for the even-numbered word lines, VvEr is applied to the even-numbered word lines while Vread is applied to the odd-numbered word lines. When the erase-verify test is for the odd-numbered word lines, VvEr is applied to the odd-numbered word lines while Vread is applied to the even-numbered word lines.

Generally, the technique of alternately verifying the even- and odd-numbered word lines is beneficial after a large number of program-erase cycles. When cycles are accumulated, the number of erase loops needed to complete an erase operation can increase. The application of Vread to alternate word lines helps to increase the cell current and reduce the drain/source resistance, which can be increased due to electron trapping during cycling. This technique can slow down the increase in the number of erase loops.

Figure 17:
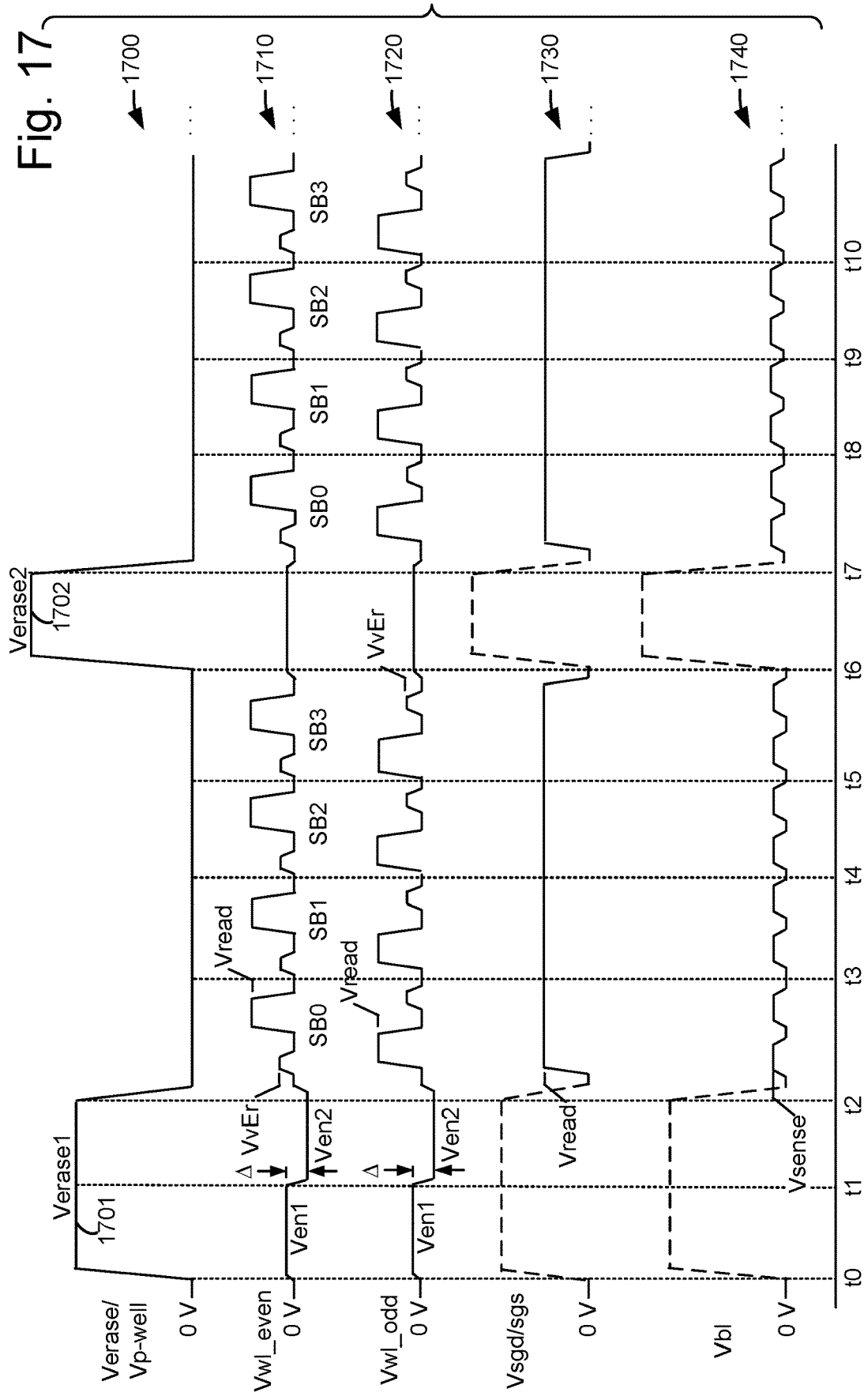
FIG. 17 depicts voltage signals in an erase operation, consistent with FIG. 12, where a two-level word line voltage, including a positive voltage and a negative voltage, is used to provide two different channel-to-gate voltages for the memory cells, and erase-verify operations are performed separately for even- and odd-numbered word lines in each of four sub-blocks.

FIG. 17 depicts voltage signals in an erase operation, consistent with FIG. 12, where a two-level word line voltage, including a positive voltage and a negative voltage, is used to provide two different channel-to-gate voltages for the memory cells, and erase-verify operations are performed separately for even- and odd-numbered word lines in each of four sub-blocks. This approach is similar to FIG. 13 except for the erase-verify tests.

Plots 1700, 1710, 1720, 1730 and 1740 depict Verase/Vp-well, Vwl_even, Vwl_odd, Vsgd/sgs and Vbl, respectively. The erase pulse 1701 is fixed at Verase1 from t0-t2. An erase-verify test can be performed for the even-numbered word lines and then the odd-numbered word lines from t2-t6. These erase-verify tests are performed in SB0-SB3 from t2-t3, t3-t4, t4-t5 and t5-t6, respectively.

Subsequently, an example erase-verify iteration is performed. Other erase-verify iterations, not shown, could also be performed. The iteration includes an erase pulse 1702 with a peak magnitude of Verase3 at t6-t7. The erase-verify tests for the even- and odd-numbered word lines are performed in SB0-SB3 from t7-t8, t8-t9, t9-t10 and after t10, respectively.

FIG. 18 depicts voltage signals in an erase operation, similar to FIG. 13, but where the two levels of the word line voltage are non-negative. Instead of Ven1>0 V and Ven2<0 V as in FIG. 13, this example shows Ven1>0 V and Ven2≥0 V. That is, both erase-enable voltages are non-negative. This approach is useful when the memory chip does not have the capability to generate negative word line voltages.

Plots 1800, 1810, 1820 and 1830 depict Verase/Vp-well, Vwl, Vsgd/sgs and Vbl, respectively. The erase pulse 1801 is fixed at Verase1 from t0-t2. An erase-verify test can be performed for all word lines from t2-t3.

Subsequently, three erase-verify iterations are performed, as an example. Each iteration includes an erase pulse 1802-1804 with a peak magnitude of Verase2-Verase4, respectively, at t3-t4, t5-t6 and t7-t8, respectively. An erase-verify test can be performed for all word lines from t4-t5, t6-t7 and after t8.

FIG. 19 depicts voltage signals in an erase operation, consistent with FIG. 12, including step 1203b, where a two-level word line voltage and a two-level erase voltage are used to provide two different channel-to-gate voltages for the memory cells, and the erase voltage is applied to a substrate.

An erase pulse at Verase1 is applied from t0-t1, transitioned directly from Verase1 to Verase1+0.5Δ at t1 and maintained at this level from t1-t2.

Ven1 is applied from t0-t1 and Ven2 is applied from t1-t2. If Ven2 is lower than Ven1 by 0.5Δ, the same amount that the erase pulse is increased, the channel-to-gate voltage will be higher by about Δ from t1-t2 compared to t0-t1. The change in Vwl can differ from the change in the erase pulse magnitude. In one approach, the sum of the magnitude of the change in Vwl and the magnitude of the change in the erase pulse is Δ, a desired fixed step size in channel-to-gate voltage for the erase operation. For example, Verase3 can be higher than Verase1+0.5Δ by Δ, Verase4 can be higher than Verase3 by Δ, and Verase5 can be higher than Verase4 by Δ.

Plots 1900, 1910, 1920 and 1930 depict Verase/Vp-well, Vwl, Vsgd/sgs and Vbl, respectively. The initial erase pulse has two levels (plots 1901 and 1902), as mentioned, at t0-t2. An erase-verify test can be performed for all word lines from t2-t3.

Subsequently, three erase-verify iterations are performed, as an example. Each iteration includes an erase pulse 1903-1905 with a peak magnitude of Verase2-Verase4, respectively, at t3-t4, t5-t6 and t7-t8, respectively. Verase2 can be higher than Verase1 by (1.5Δ) to provide a channel-to-gate voltage at t3-t4 which is (Δ) higher than at t1-t2. This is because Vwl=Ven1 at t3-t4. That is, with Ven higher by 0.5Δ, Verase has to be higher by about 1.5Δ for the channel-to-gate voltage to be higher by Δ. An erase-verify test can be performed for all word lines from t4-t5, t6-t7 and after t8.

FIG. 20 depicts voltage signals in an erase operation, consistent with FIG. 12, where a two-level word line voltage and a two-level erase voltage are used to provide three different channel-to-gate voltages for the memory cells, and the erase voltage is applied to a substrate. This approach combines the features of changing Vwl while keeping the erase pulse magnitude fixed and changing the erase pulse magnitude while keeping Vwl fixed. This approach provides flexibility in achieving time and current savings while also obtaining a desired channel-to-gate voltage. In this case, erase-verify tests are not performed until after three different channel-to-gate voltages or biases are applied to the memory cells. These channel-to-gate voltages can be set at a level such that the erase operation will not be completed until after additional erase pulses are applied.

The erase pulse is fixed at Verase1 from t0-t2 while Vwl transitions from Ven1 to Ven2 at t1. Vwl is then fixed at Ven2 from t1-t3 while the erase pulse magnitude directly transitions (increases) at t2 by Δ, from Verase1 (plot 2001) to Verase2 (plot 2002). A direct transition from Verase1 to Verase2, for example, can involve requesting that a voltage driver output Verase1, e.g., 15 V, for a period of time, then requesting that the voltage driver output Verase2, e.g., 17 V, for another, adjacent period of time. Or, the voltage driver can be requested to output different voltages in a sequence which also provides a direct transition from Verase1 to Verase2, e.g., in a sequence such as 15 V, 16 V, 17 V.

Plots 2000, 2010, 2020 and 2030 depict Verase/Vp-well, Vwl, Vsgd/sgs and Vbl, respectively. The initial erase pulse has two levels, as mentioned, at t0-t3. An erase-verify test can be performed for all word lines from t3-t4.

Subsequently, three erase-verify iterations are performed, as an example. Each iteration includes an erase pulse 2003-2005 with a peak magnitude of Verase3-Verase5, respectively, at t4-t5, t6-t7 and t8-t9, respectively. An erase-verify test can be performed for all word lines from t5-t6, t7-t8 and after t9. Regarding the difference between Verase3 and Verase2, with Ven higher by Δ, compared to the level in t1-t3, Verase has to be higher by about 2Δ for the channel-to-gate voltage to be higher by Δ.

In the above examples, the erase operation provides a positive channel-to-gate voltage for the memory cells by increasing the channel voltage. Another option is to apply a negative erase pulse to the word lines while the channel voltage is fixed at 0 V or higher. Moreover, the erase operation can be used with various type of memory cells.

FIG. 21 depicts voltage signals in an erase operation, where a negative voltage VT1 is applied to a first terminal of a memory cell and a non-negative voltage VT2 is applied to a second terminal of the memory cell. This example can refer to any type of memory cell having two terminals, e.g., which can be programmed using a voltage across the terminals of a first polarity and erased using a voltage across the terminals of a second, opposite polarity.

A plot 2100 depicts erase pulses which have a negative polarity being applied to a first terminal T1, while a plot 2110 depicts a two-level non-negative voltage being applied to a second terminal T2. A plot 2101 depicts a fixed Verase1 from t0-t2. VT2 is set to Ven1b at t0-t1 and Ven2c at t1-t2. Ven2c is higher than Ven1b by Δ. An erase-verify operation is performed at t2-t3, t4-t5, t6-t7 and after t8, when VT1 returns to 0 V. Since VT2 is higher by at t1-t2 compared to t0-t1, the voltage across the terminals is greater in magnitude at t1-t2. For example, assume Verase1=−15, Ven1b=0 V and Ven2c=1. From t0-t1, VT1−VT2=−15−0=−15 V and from t1-t2, VT1−VT2=−15−1=−16 V.

The next erase pulse, Verase2 (plot 2102) has a magnitude which is higher than the magnitude of Verase1 by 2Δ. This is because Vwl=Ven1b at t3-t4. That is, with Ven lower by Δ, Verase has to be lower by about 2Δ for VT1−VT2 to be greater in magnitude by Δ. Verase3 (plot 2103) has a magnitude which is higher than the magnitude of Verase2 by Δ, and Verase4 (plot 2104) has a magnitude which is higher than the magnitude of Verase3 by Δ. In this case, the magnitude of VT1−VT2 to is set to five different levels during the four different erase pulses.

Accordingly, it can be see that in one implementation, an apparatus comprises: a control circuit configured to connect to a set of memory cells, the set of memory cells are arranged in NAND strings and connected to a set of word lines, each NAND string comprises a channel, a drain end and a source end, and in an erase operation for the set of memory cells, the control circuit is configured to bias the memory cells with a first channel-to-gate voltage, followed by a second channel-to-gate voltage which is greater in magnitude than the first channel-to-gate voltage; wherein to bias the memory cells with the first channel-to-gate voltage, the control circuit is configured to apply an erase pulse having a first magnitude (Verase1) to the NAND string while setting a voltage of the word lines at a first erase-enable level (Vent); and to bias the memory cells with the second channel-to-gate voltage, the control circuit is configured to keep the erase pulse at the first magnitude while transitioning the voltage of the word lines directly from the first erase-enable level to a second erase-enable level (Ven2).

In another implementation, a method comprises: performing an initial erase iteration of an erase operation for a memory cell, the performing the initial erase iteration comprises applying an erase pulse having a first magnitude (Verase1) to a channel of the memory cell while setting a control gate voltage of the memory cell at a first erase-enable level, and keeping the erase pulse at the first magnitude while transitioning the control gate voltage of the memory cell directly from the first erase-enable level to a second erase-enable level, without performing an erase-verify test for the memory cell; and after the initial erase iteration, performing a plurality of erase-verify iterations of the erase operation, each erase-verify iteration comprises an erase portion in which an erase pulse is applied to the channel, where a magnitude of the erase pulse is stepped up in successive erase-verify iterations of the plurality of erase-verify iterations, and a verify portion in which the erase-verify test is performed for the memory cell.

In another implementation, an apparatus comprises: a control circuit configured to connect to a set of memory cells, the set of memory cells are arranged in NAND strings and connected to a set of word lines, each NAND string comprises a channel, a drain end and a source end; and a memory interface connected to the control circuit, the control circuit is configured to issue a command via the memory interface to, in an erase operation for the set of memory cells, bias the memory cells with a first channel-to-gate voltage, followed by a second channel-to-gate voltage which is greater in magnitude than the first channel-to-gate voltage; wherein to bias the memory cells with the first channel-to-gate voltage, the control circuit is configured to apply an erase pulse having a first magnitude (Verase1) to the NAND string while setting a voltage of the word lines at a first erase-enable level (Ven1); and to bias the memory cells with the second channel-to-gate voltage, the control circuit is configured to transition the erase pulse directly from the first magnitude to a second magnitude (Verase1+0.5×delta), which is greater than the first magnitude, while transitioning the voltage of the word lines directly from the first erase-enable level to a second erase-enable level (Ven2b).

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of memory cells, the set of memory cells are arranged in NAND strings and connected to a set of word lines, each NAND string comprises a channel, a drain end and a source end, and in an erase operation for the set of memory cells, the control circuit is configured to bias the memory cells with a first channel-to-gate voltage, followed by a second channel-to-gate voltage which is greater in magnitude than the first channel-to-gate voltage;
to bias the memory cells with the first channel-to-gate voltage, the control circuit is configured to apply an erase pulse having a first magnitude to the NAND string while setting a voltage of the word lines at a first erase-enable level; and
to bias the memory cells with the second channel-to-gate voltage, the control circuit is configured to keep the erase pulse at the first magnitude while transitioning the voltage of the word lines directly from the first erase-enable level to a second erase-enable level.

2. The apparatus of claim 1, wherein:
the control circuit is configured to transition the voltage of the word lines directly from the first erase-enable level to the second erase-enable level without performing an erase-verify test for the memory cells.

3. The apparatus of claim 1, wherein:
the control circuit is configured to bias the memory cells with a third channel-to-gate voltage which is greater in magnitude than the second channel-to-gate voltage, after the biasing of the memory cells with the second channel-to-gate voltage; and
to bias the memory cells with the third channel-to-gate voltage, the control circuit is configured to apply the erase pulse with a second magnitude, greater than the first magnitude, to the NAND string while setting the voltage on the word lines at the first erase-enable level; and
the control circuit is configured to perform an erase-verify test for the memory cells after the applying of the erase pulse with the first magnitude and before the applying of the erase pulse with the second magnitude.

4. The apparatus of claim 3, wherein:
a voltage difference between the first erase-enable level and the second erase-enable level is 40-60% of a voltage difference between the first magnitude and the second magnitude.

5. The apparatus of claim 1, wherein:
the control circuit is configured to bias the memory cells with a third channel-to-gate voltage which is greater in magnitude than the second channel-to-gate voltage, after the biasing of the memory cells with the second channel-to-gate voltage; and
to bias the memory cells with the third channel-to-gate voltage, the control circuit is configured to keep the erase pulse at the first magnitude while transitioning the voltage of the word lines directly from the second erase-enable level to a third erase-enable level without performing an erase-verify test for the memory cells.

6. The apparatus of claim 1, wherein:
the control circuit is configured to bias the memory cells with a third channel-to-gate voltage which is greater in magnitude than the second channel-to-gate voltage, after the biasing of the memory cells with the second channel-to-gate voltage; and
to bias the memory cells with the third channel-to-gate voltage, the control circuit is configured to keep the voltage of the word lines at the second erase-enable level while transitioning the erase pulse directly from the first magnitude to a second magnitude.

7. The apparatus of claim 1, wherein:
the second erase-enable level is less than the first erase-enable level.

8. The apparatus of claim 1, wherein:
the first erase-enable level is a non-negative voltage and the second erase-enable level is a negative voltage.

9. The apparatus of claim 1, wherein:
the source end of the NAND string is connected to a substrate; and
the erase pulse at the first level is applied to the source end of the NAND string via the substrate to charge up the channel.

10. The apparatus of claim 1, wherein:
the NAND string comprises a select gate transistor at the drain end;
the drain end is connected to a bit line; and
the erase pulse at the first level is applied to the bit line while the select gate transistor is biased with a voltage which is less than the first level to charge up the channel of the NAND string via gate-induced drain leakage at the select gate transistor.

11. A method, comprising:
performing an initial erase iteration of an erase operation for a memory cell, the performing the initial erase iteration comprises applying an erase pulse having a first magnitude to a channel of the memory cell while setting a control gate voltage of the memory cell at a first erase-enable level, and keeping the erase pulse at the first magnitude while transitioning the control gate voltage of the memory cell directly from the first erase-enable level to a second erase-enable level, without performing an erase-verify test for the memory cell; and
after the initial erase iteration, performing a plurality of erase-verify iterations of the erase operation, each erase-verify iteration comprises an erase portion in which an erase pulse is applied to the channel, where a magnitude of the erase pulse is stepped up in successive erase-verify iterations of the plurality of erase-verify iterations, and a verify portion in which the erase-verify test is performed for the memory cell.

12. The method of claim 11, wherein:
the erase pulse has a second magnitude in a first erase-verify iteration of the plurality of erase-verify iterations; and
a voltage difference between the first erase-enable level and the second erase-enable level 40-60% of a voltage difference between the first magnitude and the second magnitude.

13. The method of claim 11, further comprising:
in the initial erase iteration, while keeping the erase pulse at the first magnitude, transitioning the control gate voltage of the memory cell directly from the second erase-enable level to a third erase-enable level, without performing an erase-verify test for the memory cell.

14. The method of claim 11, wherein:
the second erase-enable level is less than the first erase-enable level.

15. The method of claim 11, wherein:
the first erase-enable level is a non-negative voltage and the second erase-enable level is a negative voltage.

16. An apparatus, comprising:
a control circuit configured to connect to a set of memory cells, the set of memory cells are arranged in NAND strings and connected to a set of word lines, each NAND string comprises a channel, a drain end and a source end; and
a memory interface connected to the control circuit, the control circuit is configured to issue a command via the memory interface to, in an erase operation for the set of memory cells, bias the memory cells with a first channel-to-gate voltage, followed by a second channel-to-gate voltage which is greater in magnitude than the first channel-to-gate voltage;
to bias the memory cells with the first channel-to-gate voltage, the control circuit is configured to apply an erase pulse having a first magnitude to the NAND string while setting a voltage of the word lines at a first erase-enable level; and
to bias the memory cells with the second channel-to-gate voltage, the control circuit is configured to transition the erase pulse directly from the first magnitude to a second magnitude, which is greater than the first magnitude, while transitioning the voltage of the word lines directly from the first erase-enable level to a second erase-enable level.

17. The apparatus of claim 16, wherein:
the second erase-enable level is less than the first erase-enable level; and
the second magnitude is greater than the first magnitude.

18. The apparatus of claim 16, wherein:
a transition between the biasing of the memory cells with the first channel-to-gate voltage and the biasing of the memory cells with the second channel-to-gate voltage occurs without performing an erase-verify test for the memory cells.

19. The apparatus of claim 16, wherein:
the control circuit is configured to, in the erase operation for the set of memory cells, bias the memory cells with a third channel-to-gate voltage which is greater in magnitude than the second channel-to-gate voltage, after the biasing of the memory cells with the second channel-to-gate voltage; and
to bias the memory cells with the third channel-to-gate voltage, the control circuit is configured to apply the erase pulse with a third magnitude, greater than the second magnitude, to the NAND string while setting the voltage on the word lines at the first erase-enable level; and
a voltage difference between the first erase-enable level and the second erase-enable level is 25-40% of a voltage difference between the second magnitude and the third magnitude.

20. The apparatus of claim 19, wherein:
the control circuit is configured to perform an erase-verify test for the memory cells after the applying of the erase pulse with the second magnitude and before the applying of the erase pulse with the third magnitude.

* * * * *